(12) United States Patent
Azakami et al.

(10) Patent No.: US 7,551,908 B2
(45) Date of Patent: Jun. 23, 2009

(54) HIGH-FREQUENCY SIGNAL LEVEL DETECTION APPARATUS AND HIGH-FREQUENCY SIGNAL RECEIVER APPARATUS USING THE SAME

(75) Inventors: Hiroshi Azakami, Osaka (JP); Misao Teshima, Osaka (JP); Shougo Sasaki, Osaka (JP); Yoshikazu Hayashi, Osaka (JP)

(73) Assignee: Panasonic Corporation, Osaka (JP)

( * ) Notice: Subject to any disclaimer, the term of this patent is extended or adjusted under 35 U.S.C. 154(b) by 287 days.

(21) Appl. No.: 10/553,902

(22) PCT Filed: Apr. 21, 2004

(86) PCT No.: PCT/JP2004/005707

§ 371 (c)(1),
(2), (4) Date: Aug. 3, 2006

(87) PCT Pub. No.: WO2004/095725

PCT Pub. Date: Nov. 4, 2004

(65) Prior Publication Data

US 2007/0041480 A1      Feb. 22, 2007

(30) Foreign Application Priority Data

| Apr. 21, 2003 | (JP) | ............................. 2003-115553 |
| Sep. 19, 2003 | (JP) | ............................. 2003-327789 |

(51) Int. Cl.
*H04B 1/16* (2006.01)

(52) U.S. Cl. ................................. 455/237.1; 455/226.2

(58) Field of Classification Search ................. 455/566, 455/154.1, 155.1, 226.1, 226.2, 226.4, 232.1, 455/234.2, 237.1, 249.1, 245.2, 253.2; 348/180–194, 348/569, 570, 725–738
See application file for complete search history.

(56) References Cited

U.S. PATENT DOCUMENTS 4,125,809 A * 11/1978 Mott ........................... 702/69

(Continued)

FOREIGN PATENT DOCUMENTS

JP   60-062246   4/1985

(Continued)

*Primary Examiner*—Blane J Jackson
(74) *Attorney, Agent, or Firm*—Wenderoth, Lind & Ponack, L.L.P.

(57) ABSTRACT

In a high-frequency signal level detection apparatus for detecting an inputted signal level of a high-frequency signal, an AGC circuit executes an AGC on an intermediate frequency (IF) signal obtained by converting a frequency of a received high-frequency signal, using an RFAGC value and an IFAGC value for controlling gains of the high-frequency signal and the IF signal, respectively, based on the IF signal so that an output level of the IF signal is substantially constant. A controller previously measures first and second relational data, indicating an RFAGC value and an IFAGC value relative to the inputted signal level of the received high-frequency signal, respectively, measures the RFAGC and IFAGC values when a high-frequency signal to be measured is received, and detects the inputted signal level of the received high-frequency signal using the measured first and second relational data based on the measured RFAGC and IFAGC values.

20 Claims, 30 Drawing Sheets

U.S. PATENT DOCUMENTS

| | | | |
|---|---|---|---|
| 4,189,750 A * | 2/1980 | Sadel | 348/570 |
| 4,501,020 A * | 2/1985 | Wakeman | 455/226.1 |
| 5,451,839 A * | 9/1995 | Rappaport et al. | 375/224 |
| 6,310,646 B1 * | 10/2001 | Shi et al. | 348/194 |
| 6,650,878 B1 | 11/2003 | Abe et al. | |
| 6,668,164 B2 * | 12/2003 | Hughes | 455/234.1 |
| 6,934,522 B2 | 8/2005 | Konishi et al. | |
| 6,996,383 B2 * | 2/2006 | Hughes et al. | 455/138 |
| 7,006,824 B1 * | 2/2006 | Tse et al. | 455/423 |
| 2002/0131533 A1 | 9/2002 | Koizumi | |

FOREIGN PATENT DOCUMENTS

| | | |
|---|---|---|
| JP | 62-93843 | 6/1987 |
| JP | 9-199962 | 7/1997 |
| JP | 11-355079 | 12/1999 |
| JP | 2000-209118 | 7/2000 |
| JP | 2001-102947 | 4/2001 |
| JP | 2001-186083 | 7/2001 |
| JP | 2002-84205 | 3/2002 |
| JP | 2002-217763 | 8/2002 |
| JP | 2002-280852 | 9/2002 |

* cited by examiner

Fig.23

PROCESSING FOR GENERATING DISPLAY CONTROL PROGRAM

S101: WITH CONTROLLING HIGH-FREQUENCY SIGNAL GENERATOR 65 TO CHANGE INPUTTED SIGNAL LEVEL OF HIGH-FREQUENCY SIGNAL INPUTTED TO INPUT TERMINAL 1 AND HAVING MINIMUM FREQUENCY $f_{1min}$ OF 57 MHz WITHIN FIRST FREQUENCY RANGE FR1 FROM −20 dBmV TO +20 dBmV EVERY ONE dBmV, READ OUT IFAGC REGISTER VALUES AND RFAGC REGISTER VALUES CORRESPONDING TO RESPECTIVE INPUTTED SIGNAL LEVELS FROM IFAGC REGISTER 33 AND RFAGC REGISTER 43, RESPECTIVELY, AND STORE THE READ-OUT SAME VALUES IN DATA MEMORY 62

S102: WITH CONTROLLING HIGH-FREQUENCY SIGNAL GENERATOR 65 TO CHANGE INPUTTED SIGNAL LEVEL OF HIGH-FREQUENCY SIGNAL INPUTTED TO INPUT TERMINAL 1 AND HAVING MAXIMUM FREQUENCY $f_{1max}$ WITHIN FIRST FREQUENCY RANGE FR1 AND MINIMUM FREQUENCY $f_{2min}$ OF 459 MHz WITHIN SECOND FREQUENCY RANGE FR2 FROM −20 dBmV TO +20 dBmV EVERY ONE dBmV, READ OUT IFAGC REGISTER VALUES AND RFAGC REGISTER VALUES CORRESPONDING TO RESPECTIVE INPUTTED SIGNAL LEVELS FROM IFAGC REGISTER 33 AND RFAGC REGISTER 43, RESPECTIVELY, AND STORE THE READ-OUT SAME VALUES IN DATA MEMORY 62

S103: WITH CONTROLLING HIGH-FREQUENCY SIGNAL GENERATOR 65 TO CHANGE INPUTTED SIGNAL LEVEL OF HIGH-FREQUENCY SIGNAL INPUTTED TO INPUT TERMINAL 1 AND HAVING MAXIMUM FREQUENCY $f_{2max}$ OF 861 MHz WITHIN SECOND FREQUENCY RANGE FR2 FROM −20 dBmV TO +20 dBmV EVERY ONE dBmV, READ OUT IFAGC REGISTER VALUES AND RFAGC REGISTER VALUES CORRESPONDING TO RESPECTIVE INPUTTED SIGNAL LEVELS FROM IFAGC REGISTER 33 AND RFAGC REGISTER 43, RESPECTIVELY, AND STORE THE READ-OUT SAME VALUES IN DATA MEMORY 62

S104: SEARCH THE MAXIMUM VALUE OF RFAGC REGISTER VALUES BASED ON THE MEASURED RFAGC REGISTER VALUES AT MINIMUM FREQUENCY $f_{1min}$ OF FIRST FREQUENCY RANGE FR1, STORE THE SEARCHED MAXIMUM VALUE IN DATA MEMORY 62 AS THE MAXIMUM VALUE OF RFAGC REGISTER VALUES WITHIN FIRST FREQUENCY RANGE FR1, SEARCH A RANGE OF INPUTTED SIGNAL LEVELS WHEN RFAGC REGISTER VALUE HAS THE MAXIMUM VALUE, SET THE SEARCHED RANGE AS LEVEL RANGE LR11 OF FIRST FREQUENCY RANGE FR1, AND SET THE RANGE OF INPUTTED SIGNAL LEVELS WHEN RFAGC REGISTER VALUE HAS NOT THE MAXIMUM VALUE AS LEVEL RANGE LR12 OF FIRST FREQUENCY RANGE FR1

S105: SEARCH THE MAXIMUM VALUE OF RFAGC REGISTER VALUES BASED ON THE MEASURED RFAGC REGISTER VALUES AT MINIMUM FREQUENCY $f_{2min}$ OF SECOND FREQUENCY RANGE FR2, STORE THE SEARCHED MAXIMUM VALUE IN DATA MEMORY 62 AS THE MAXIMUM VALUE OF RFAGC REGISTER VALUES WITHIN SECOND FREQUENCY RANGE FR2, SEARCH A RANGE OF INPUTTED SIGNAL LEVELS WHEN RFAGC REGISTER VALUE HAS THE MAXIMUM VALUE, SET THE SEARCHED RANGE AS LEVEL RANGE LR21 OF SECOND FREQUENCY RANGE FR2, AND SET THE RANGE OF INPUTTED SIGNAL LEVELS WHEN RFAGC REGISTER VALUE HAS NOT THE MAXIMUM VALUE AS LEVEL RANGE LR22 OF SECOND FREQUENCY RANGE FR2

(C)

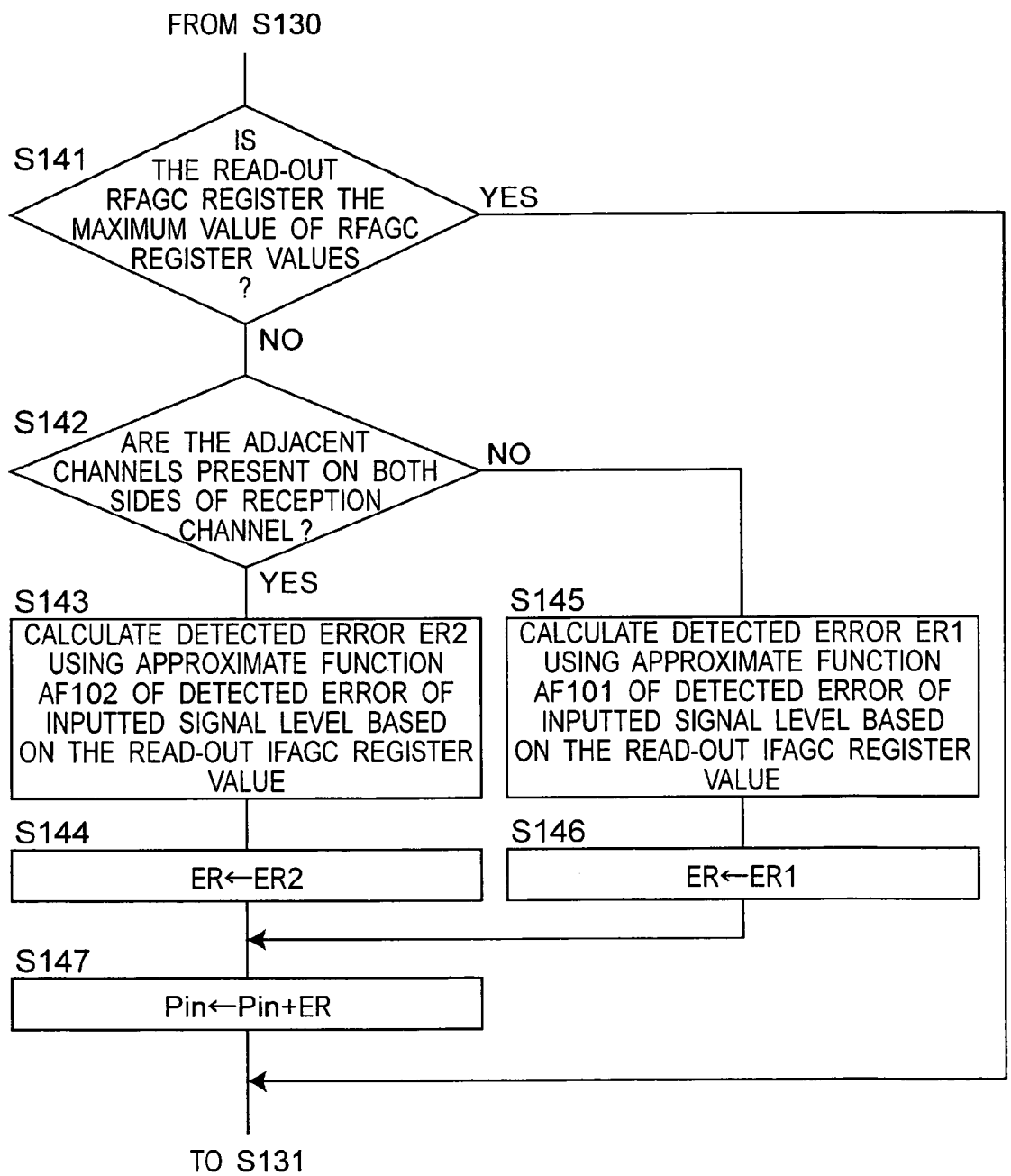

HIGH-FREQUENCY SIGNAL LEVEL DETECTION APPARATUS AND HIGH-FREQUENCY SIGNAL RECEIVER APPARATUS USING THE SAME

TECHNICAL FIELD

The present invention relates to a high-frequency signal level detection apparatus for detecting a signal level of a high-frequency signal which is received by either an antenna or a cable, and to a high-frequency signal receiver apparatus using the same high-frequency signal level detection apparatus.

BACKGROUND ART

As a high-frequency signal level detection apparatus for detecting a signal level of a high-frequency signal received by an antenna or a cable, various kinds of apparatuses have been conventionally proposed, examples of which are disclosed in the following prior art documents.

(1) Japanese patent application laid-open publication No. 2002-217763 (hereinafter, referred to as a prior art document 1).

(2) Japanese patent application laid-open publication No. 9-199962 (hereinafter, referred to as a prior art document 2).

(3) Japanese patent application laid-open publication No. 60-062246 (hereinafter, referred to as a prior art document 3).

(4) Japanese utility model laid-open publication No. 62-093843 (hereinafter, referred to as a prior art document 4).

In each of these prior art documents 1 to 4, the signal level is basically detected based on an AGC (Automatic Gain Control) voltage that is a control voltage outputted from an AGC circuit that controls the signal level of a received high-frequency signal to be substantially constant.

The apparatus described in, for example, the prior art document 1 (hereinafter, referred to as a prior art apparatus) is characterized by generating a mapping function by correcting an AGC value by a predetermined value for a signal at a predetermined frequency or higher at which a change in the AGC value is greater according to characteristics of a high-frequency circuit block, storing the generated mapping function in a memory, correcting an AGC voltage by a predetermined value when a reception frequency at which an input level is displayed exceeds the predetermined frequency, and calculating a display level value of an inputted signal by the mapping function so as to reduce a display error in the display of the input level, and this leads to that an error may be caused due to a difference in reception frequency.

DISCLOSURE OF THE INVENTION

However, the prior art apparatus stores mapping function data in the memory. Due to this, in order to realize the display of the signal level with higher accuracy, a frequency range is divided into narrow frequency ranges and the mapping function data are stored for respective narrow frequency ranges, resulting in an increase in a memory capacity. When the signal level is displayed with a predetermined memory capacity, there is caused such a problem that the accuracy is insufficiently low.

Furthermore, the prior art apparatus calculates the signal level based only on a relationship between the signal level and an RFAGC voltage. As a result, there is caused such a problem that the accuracy for displaying the signal level is often deteriorated. Besides, when an interference signal is present on an adjacent channel, there is caused such a problem that the RFAGC voltage is influenced by the interference signal, resulting in deterioration of the accuracy for displaying the signal level.

The object of the present invention is therefore to provide a high-frequency signal level detection apparatus capable of solving the above-stated problems and detecting a signal level of a high-frequency signal with accuracy higher than that of the prior art, and a high-frequency signal receiver apparatus using the same.

According to one aspect view of the present invention, there is provided a high-frequency signal level detection apparatus which includes an AGC circuit and detecting means. The AGC circuit executes an automatic gain control on an intermediate frequency signal obtained by converting a frequency of a received high-frequency signal, using an RFAGC value for controlling a gain of the high-frequency signal and an IFAGC value for controlling a gain of the intermediate frequency signal based on the intermediate frequency signal so that an output level of the intermediate frequency signal is substantially constant. The detecting means previously measures first relational data indicating an RFAGC value relative to an inputted signal level of the received high-frequency signal and second relational data indicating an IFAGC value relative to the inputted signal level of the received high-frequency signal. When a high-frequency signal to be measured is received, the detecting means measures the RFAGC value and the IFAGC value and detects the inputted signal level of the received high-frequency signal using the measured first and second relational data based on the measured RFAGC value and IFAGC value.

In the above-mentioned high-frequency signal level detection apparatus, the detecting means preferably detects the inputted signal level of the received high-frequency signal using only the second relational data based on the measured IFAGC value when the gain of the high-frequency signal is a maximum value thereof.

In the above-mentioned high-frequency signal level detection apparatus, the detecting means preferably detects the inputted signal level of the received high-frequency signal using only the first relational data based on the measured RFAGC value when the gain of the high-frequency signal is not a maximum value thereof.

In the above-mentioned high-frequency signal level detection apparatus, the detecting means preferably detects a first inputted signal level of the received high-frequency signal using the measured first relational data based on the measured RFAGC value, then detects a second inputted signal level of the received high-frequency signal using the measured second relational data based on the measured IFAGC value, and then detects an average value of the detected first and second inputted signal levels as the inputted signal level of the received high-frequency signal.

In the above-mentioned high-frequency signal level detection apparatus, the received high-frequency signal preferably has a plurality of frequencies. The detecting means preferably previously measures a first relational data indicating the RFAGC value relative to the inputted signal level and a second relational data indicating the IFAGC value relative to the inputted signal level using a high-frequency signal having a substantial central frequency among the frequencies.

In the above-mentioned high-frequency signal level detection apparatus, the received high-frequency signal preferably has a plurality of frequencies. The detecting means preferably previously measures the following parts using two high-frequency signals having a maximum frequency and a minimum frequency among the frequencies, respectively:

(a) a first part of the first relational data indicating the RFAGC value relative to the inputted signal level of the high-frequency signal having the maximum frequency;

(b) a first part of the second relational data indicating the IFAGC value relative to the inputted signal level of the high-frequency signal having the maximum frequency;

(c) a second part of the first relational data indicating the RFAGC value relative to the inputted signal level of the high-frequency signal having the minimum frequency; and (d) a second part of the second relational data indicating the IFAGC value relative to the inputted signal level of the high-frequency signal having the minimum frequency.

After that, detecting means detects a first inputted signal level of the received high-frequency signal using the measured first part of the first relational data based on the measured RFAGC value, then detects a second inputted signal level of the received high-frequency signal using the measured first part of the second relational data based on the measured IFAGC value, and then detects an average value of the detected first and second inputted signal levels as the inputted signal level of the high-frequency signal having the maximum frequency.

Further, detecting means detects a third inputted signal level of the received high-frequency signal using the measured second part of the first relational data based on the measured RFAGC value, then detects a fourth inputted signal level of the received high-frequency signal using the measured second part of the second relational data based on the measured IFAGC value, and then detects an average value of the detected third inputted signal level and the detected fourth inputted signal level as the inputted signal level of the high-frequency signal having the minimum frequency.

Still further, detecting means calculates the inputted signal level of the high-frequency signal to be measured using a linear approximation method for linearly approximating the inputted signal level relative to a reception frequency of the high-frequency signal to be measured based on the detected inputted signal level of the high-frequency signal having the maximum frequency and on the detected inputted signal level of the high-frequency signal having the minimum frequency.

In the above-mentioned high-frequency signal level detection apparatus, the received high-frequency signal preferably has a plurality of frequencies, and a frequency range including the frequencies is divided into a plurality of frequency ranges. The detecting means preferably previously measures the first and second relational data in each of the divided frequency ranges, and then detects the inputted signal level of the received high-frequency signal using the measured first and second relational data corresponding to the frequency range to which the frequency of the high-frequency signal to be measured belongs.

In the above-mentioned high-frequency signal level detection apparatus, the detecting means preferably previously measures third relational data, that is a detected error in the IFAGC value of the second relational data indicating the IFAGC value relative to the inputted signal level of the received high-frequency signal, the detected error being caused, between a case with an interference signal of a further high-frequency signal in the vicinity of the frequency of the high-frequency signal to be measured, and a case with no interference signal thereof. The detecting means preferably detects the detected error using the third relational data based on the IFAGC value measured for the high-frequency signal to be measured, and corrects the detected inputted signal level using the, detected error.

In the above-mentioned high-frequency signal level detection apparatus, the detecting means preferably previously measures the following parts:

(a) a first part of third relational data, that is a first detected error in the IFAGC value of the second relational data indicating the IFAGC value relative to the inputted signal level of the received high-frequency signal, the first detected error being caused, between a first case with interference signals of further high-frequency signals located on both sides of the frequency of the high-frequency signal to be measured, and a case with no interference signal thereof; and (b) a second part of the third relational data, that is a second detected error in the IFAGC value of the second relational data indicating the IFAGC value relative to the inputted signal level of the received high-frequency signal, the second detected error being caused, between a second case with an interference signal of further high-frequency signal located on one side of the frequency of the high-frequency signal to be measured, and a case with no interference signal thereof.

The detecting means preferably detects one of the first and second detected errors based on the IFAGC value measured for the high-frequency signal to be measured using one of the first and second parts of the third relational data which respectively correspond to states in which the high-frequency signal to be measured is in the first and second cases, and corrects the detected inputted signal level using the detected error.

In the above-mentioned high-frequency signal level detection apparatus, the detecting means preferably represents the first relational data and the second relational data by predetermined approximate functions, respectively, and detects the inputted signal level of the received high-frequency signal using the approximate function of the first relational data and the approximate function of the second relational data.

The above-mentioned high-frequency signal level detection apparatus preferably further includes display means for displaying the inputted signal level detected by the detecting means.

According to another aspect view of the present invention, there is provided a high-frequency signal receiver apparatus which includes a receiver for receiving a high-frequency signal, for converting the received high-frequency signal into an intermediate frequency signal, and for outputting the intermediate frequency signal and the above-mentioned high-frequency signal level detection apparatus.

Therefore, according to the present invention, the first relational data indicating the RFAGC value relative to the inputted signal level of the received high-frequency signal and the second relational data indicating the IFAGC value relative to the inputted signal level of the received high-frequency signal are measured in advance. The RFAGC value and the IFAGC value when the high-frequency signal to be measured is received are measured. Based on the measured RFAGC value and IFAGC value, the inputted signal level of the received high-frequency signal is detected using the measured first and second relational data. Therefore, it is possible to detect the signal level of the high-frequency signal with accuracy higher than that of the prior art.

BRIEF DESCRIPTION OF DRAWINGS

FIG. 23 is a flowchart showing a first part of a processing for generating a display control program, which is executed by a controller 60 of a measurement control system according to a sixth preferred embodiment.

FIG. 30 is a flowchart showing a characteristic part of a processing for controlling display executed by a controller 50 according to the seventh preferred embodiment.

BEST MODE FOR CARRYING OUT THE INVENTION

Various kinds of referred preferred embodiments according to the present invention will be described below with reference to the drawings. Components similar to each other are denoted by the same numerical references.

First Preferred Embodiment

Figure 1:
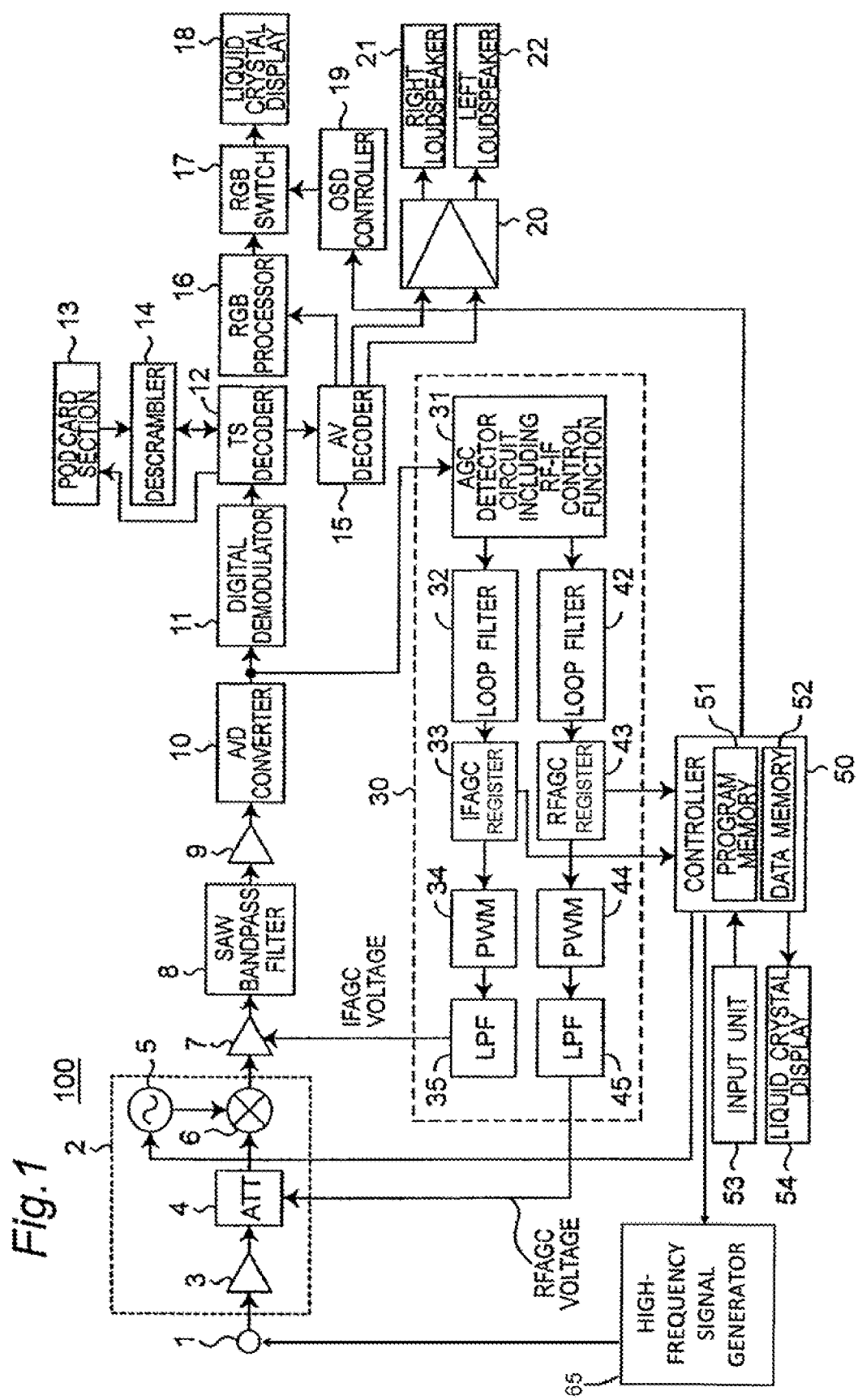
FIG. 1 is a block diagram showing a configuration of a television receiver 100 that includes a high-frequency signal level detection and display function according to a first preferred embodiment of the present invention.
Figure 2:
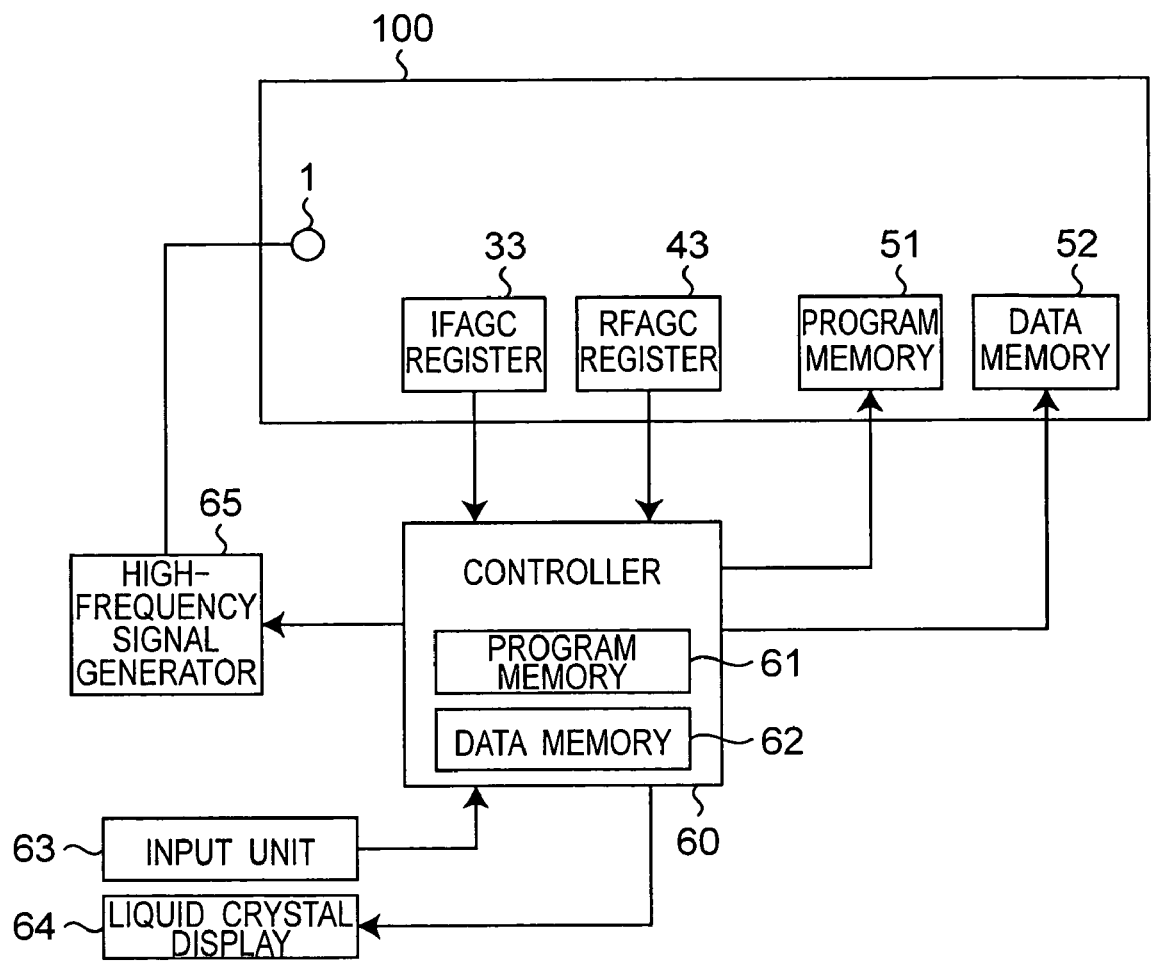
FIG. 2 is a block diagram showing a configuration of a measurement control system for generating a display control program for the high-frequency signal level detection and display function of the television receiver 100 shown in FIG. 1.

FIG. 1 is a block diagram showing a configuration of a television receiver 100 that includes a high-frequency signal level detection and display function according to a first preferred embodiment of the present invention FIG. 2 is a block diagram showing a configuration of a measurement control system for generating a display control program for the high-frequency signal level detection and display function of the television receiver 100 shown in FIG. 1.

Figure 4:
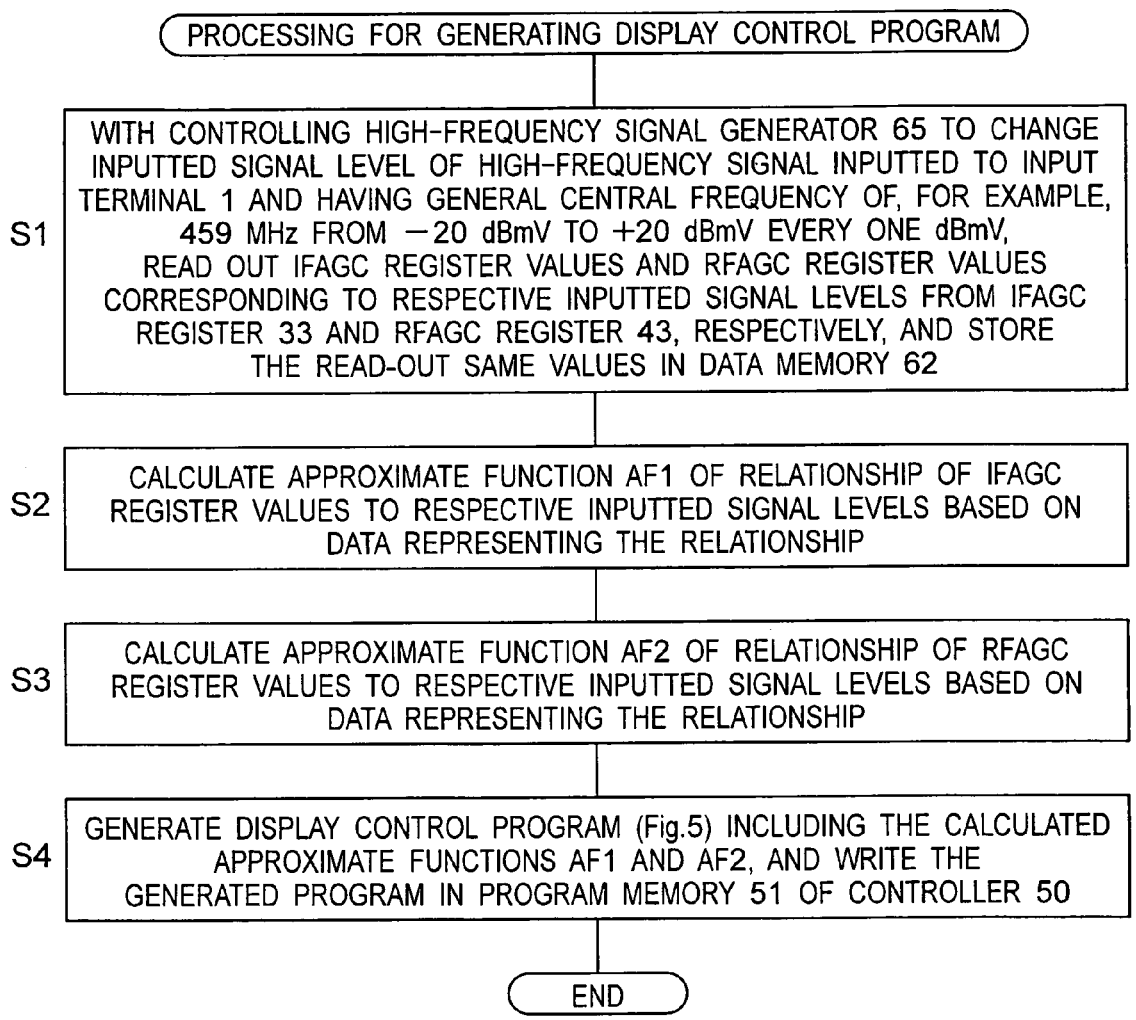
FIG. 4 is a flowchart showing a processing for generating the display control program, which is executed by a controller 60 of the measurement control system shown in FIG. 2.

The television receiver 100 according to the present preferred embodiment is a high-frequency signal receiver apparatus that includes a set-top box (where a video signal processing is executed by a part up to an RGB switch 17 shown in FIG. 1, and an audio signal processing is executed by a part up to a low frequency amplifier 20 shown in FIG. 1) for receiving a digital broadcasting signal such as a cable television (hereinafter, referred to as a CATV). The television receiver 100 includes an AGC circuit 30 that generates an RFAGC voltage for controlling an attenuation amount of an attenuator 4 so as to keep a signal level of a high-frequency (RF) signal substantially constant, and an IFAGC voltage for controlling an amplification factor of an intermediate frequency amplifier 7 so as to keep a signal level of an intermediate frequency (IF) signal substantially constant. In this case, as shown in FIG. 4, a controller 60 of the measurement control system is characterized by controlling a high-frequency signal generator 65 to change an inputted signal level of a high-frequency signal inputted to an input terminal 1, calculating each of approximate functions AF1 and AF2 based on relationships of an IFAGC register value and an RFAGC register value to the changed inputted signal levels, respectively, generating a display control program (FIG. 5) including these approximate functions AF1 and AF2, and writing the generated display control program into a program memory 51 of a controller 50. Further, the controller 50 of the television receiver 100 is characterized by executing the display control program shown in FIG. 5, so as to calculate an inputted signal level Pif using the approximate function AF1 based on the IFAGC register value and to calculate an inputted signal level Prf using the approximate function AF2 based on the RFAGC register value, and to calculate and display an average value of these inputted signal levels Pif and Prf as an inputted signal level Pin when a user actually views and listens to the broadcasting signal.

First of all, the configuration and operation of the television receiver 100 shown in FIG. 1 will be described below in detail.

Referring to FIG. 1, a head end apparatus of a CATV broadcasting company is connected to the input terminal 1 through, for example, a coaxial cable. A front end circuit 2 is configured to include a high-frequency amplifier 3, the attenuator 4, the attenuation amount of which is controlled by the RFAGC voltage outputted from a low-pass filter (LPF) 45 within the AGC circuit 30, the local oscillator 5, a local oscillation frequency of which is controlled by the controller 50, so as to control a frequency of a broadcasting channel from the television receiver 100, and a mixer 6. The digital broadcasting signal from the head end apparatus is inputted to the mixer 6 through the input terminal 1, the high-frequency amplifier 3, and the attenuator 4. On the other hand, a local oscillation signal from the local oscillator 5 is inputted to the mixer 6. The mixer 6 mixes up the two inputted signals, and outputs a resultant mixed signal to an A/D converter 10 through the intermediate frequency amplifier 7, an SAW bandpass filter 8, and an intermediate frequency amplifier 9. In this case, the SAW bandpass filter 8 substantially bandpasses only a signal component on one channel of the broadcasting signal, so as to extracts a low frequency converted intermediate frequency signal (hereinafter, referred to as an IF signal) corresponding to the signal component on one channel of the broadcasting signal, from the resultant mixed signal. Further, the A/D converter 10 converts the inputted IF signal into a digital signal at a predetermined sampling frequency, and outputs the digital signal to a digital demodulator 11 and an AGC detector circuit 31 that includes an RF-IF control function and that is provided in the AGC circuit 30.

The digital demodulator 11 includes an error correction circuit and digitally demodulates the inputted digital signal and outputs the demodulated signal to a TS decoder 12. The TS decoder 12 transmits the inputted digitally-demodulated digital signal to a descrambler 14 through an POD card section 13 that stores security information on the broadcasting company. Then the descrambler 14 descrambles the digitally-demodulated digital signal, extracts a transport stream signal (hereinafter, referred to as a TS signal) from the descrambled digital signal, and outputs the extracted TS signal to an AV decoder 15. The AV decoder 15 decodes a digital video signal and a digital audio signal from the inputted TS signal, outputs the digital video signal to an RGB processor 16, and outputs the digital audio signal to the low frequency amplifier 20. The RGB processor 16 converts the inputted digital video signal into an RGB video signal, and outputs the RGB video signal to a liquid crystal display 18 through the RGB switch 17. In this case, the RGB switch 17 superimposes an RGB signal generated by an OSD (On Screen Display) controller 19 based on data of the inputted signal level of the broadcasting signal from the controller 50, on the RGB signal from the RGB processor 16, and outputs a resultant superimposed RGB signal to the liquid crystal display 18 as will be described later in detail. Further, the low frequency amplifier 20 includes an A/D converter and converts inputted two channels of digital audio signals into analog audio signals, and outputs the analog audio signals to left and right loudspeakers 22 and 21.

The AGC circuit 30 is configured to include the AGC detector circuit 31 that includes the RF-IF control function, loop filters 32 and 42, an IFAGC register 33, an RFAGC register 433 pulse width modulators 34 and 44, and low-pass filters 35 and 45. The AGC detector circuit 31 detects the IF signal inputted from the A/D converter 10, determines an operating ratio of an RFAGC to an IFAGC from a level value of the IF signal, generates an RFAGC signal and an IFAGC signal based on the determined ratio, and then, controls an RFAGC loop and an IFAGC loop, so as to adjust the broadcasting signal inputted at various kinds of inputted signal levels depending on a reception location or a reception channel (e.g., at an inputted signal level difference of about 90 dB when the received broadcasting signal is a terrestrial digital broadcasting signal, and at an inputted signal level difference of about 30 dB for a digital cable) to substantially such a constant amplitude level that the digital demodulator 11 in rear of the AGC detector circuit 31 can correctly demodulate the broadcasting signal. The IFAGC signal from the AGC detector circuit 31 is subjected to time averaging by the loop filter 32 that serves as a predetermined low-pass filter, and a signal value of the resultant IFAGC signal is temporarily stored in the IFAGC register 33. Further, the pulse width modulator 34 modulates a pulse width of the IFAGC signal according to an IFAGC register value stored in the IFAGC register 33 using, for example, Δ-Σ modulation method, and the pulse width modulated IFAGC signal is transformed to the IFAGC voltage through the bandpass filter 35, and the IFAGC voltage becomes a control signal for controlling the amplification factor of the intermediate frequency amplifier 7. On the other hand, the RFAGC signal from the AGC detector circuit 31 is subjected to time averaging by the loop filter 42 that serves as a predetermined low-pass filter, and a signal value of the resultant RFAGC signal is temporarily stored in the RFAGC register 43. Further, the pulse width modulator 44 modulates a pulse width of the RFAGC signal according to an RFAGC register value stored in the RFAGC register 43 using, for example, the Δ-Σ modulation method, and the pulse width modulated RFAGC signal is transformed to the RFAGC voltage through the bandpass filter 45, and the RFAGC voltage becomes a control signal for controlling the attenuation amount of the attenuator 4.

In this case, the IFAGC register value and the RFAGCA register value stored in the IFAGC register 33 and the RFAGC register 43, respectively, are read out by the controller 50, and used to generate the approximate functions AF1 and AF2, to be described later in detail, as well as to calculate the inputted signal level Pin.

The controller 50, which is constituted by, for example, a microcomputer, controls entirety of the television receiver 100 according to a program stored in the program memory. 51, and stores data that is temporarily calculated during execution of the program in the data memory 52. An input unit 53 for inputting a channel number for selecting a broadcasting channel, a command to display the inputted signal level and the like is connected to the controller 50. In addition, the liquid crystal display 54 for displaying input values and set values inputted or set to the controller 50 is connected to the controller 50. In the present preferred embodiment, the controller 50 executes the display control program generated by the controller 60 shown in FIG. 2 and stored in the program memory 51, so as to calculate and display the inputted signal level of the digital broadcasting signal which the user views and listens to.

In the measurement control system shown in FIG. 2, a high-frequency signal generator 65 is connected to the input terminal 1 of the television receiver 100, and the controller 60 controls a frequency of a high-frequency signal generated -by the high-frequency signal generator 65. The controller 60, which is constituted by, for example, a microcomputer, controls entirety of the measurement control system according to a program stored in a program memory 61, and stores data that is temporarily calculated during execution of the program in a data memory 62. An input unit 63 for inputting a command to generate a display control program and the like is connected to the controller 60. In addition, a liquid crystal display 64 for displaying input values and set values inputted or set to the controller 60 and an operating state is connected to the controller 60. In the present preferred embodiment, the controller 60 executes the processing for generating the display control program shown in FIG. 4 stored in the program memory 61 as will be described later in detail. Then the controller 60 controls the high-frequency signal generator 65 to change the inputted signal level of the high-frequency signal inputted to the input terminal 1, calculates the approximate functions AF1 and AF2 based on the relationships of IFAGC register values and RFAGC register values to the changed inputted signal levels, respectively, generates the display control program (FIG. 5) including these approximate functions AF1 and AF2, and writes the generated display control program into the program memory 51 of the controller 50.

Figure 3:
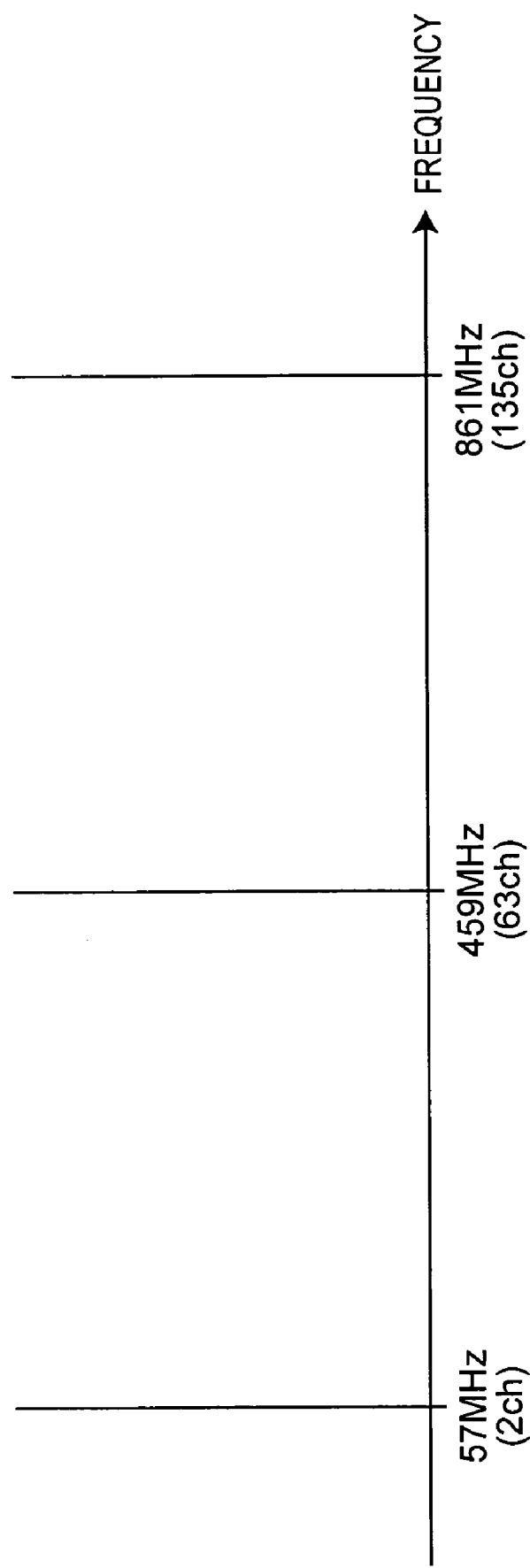
FIG. 3 is a figure showing one example of a channel allocation of cable television broadcasting signals in the U.S.A.

FIG. 3 is a figure showing one example of a channel allocation of CATV broadcasting signals in the US. As apparent from FIG. 3, the channels of the CATV broadcasting signals in the US include broadcasting signals from a 57-MHz broadcasting signal on Channel 2 to an 861-MHz broadcasting signal on Channel 135 through a 459-MHz broadcasting signal on Channel 63.

FIG. 4 is a flowchart showing a processing for generating the display control program, which is executed by the controller 60 of the measurement control system shown in FIG. 2.

Referring to FIG. 4, at step S1, with controlling the high-frequency signal generator 65 to change the inputted signal level of the high-frequency signal inputted to the input terminal 1 and having a general central frequency of, for example, 459 MHz from −20 dBmV to +20 dBmV every one dBmV, the controller 60 reads out IFAGC register values and RFAGC register values corresponding to respective inputted signal levels from the IFAGC register 33 and the RFAGC register 43, respectively, and stores the read-out same values in the data memory 62. Next, at step S2, the controller 60 calculates the approximate function AF1 of the relationship of the IFAGC register values to the respective inputted signal levels based on the data representing the relationship. At step S3, the controller 60 calculates the approximate function AF2 of the relationship of the RFAGC register values to the respective inputted signal levels based on the data representing the relationship. Further, at step S4, the controller 60 generates the display control program (FIG. 5) including the calculated approximate functions AF1 and AF2, and writes the generated program in the program memory 51 of the controller 50, thus finishing the processing for generating the display control program. In this case, each of the approximate functions can be calculated in a form of, for example, a cubic equation such as $y=ax^3+bx^2+cx+d$ using a numerical calculation method such as a least square method. In subsequent preferred embodiments, forms and calculation methods of approximate functions are similar to those according to the present invention.

Figure 5:
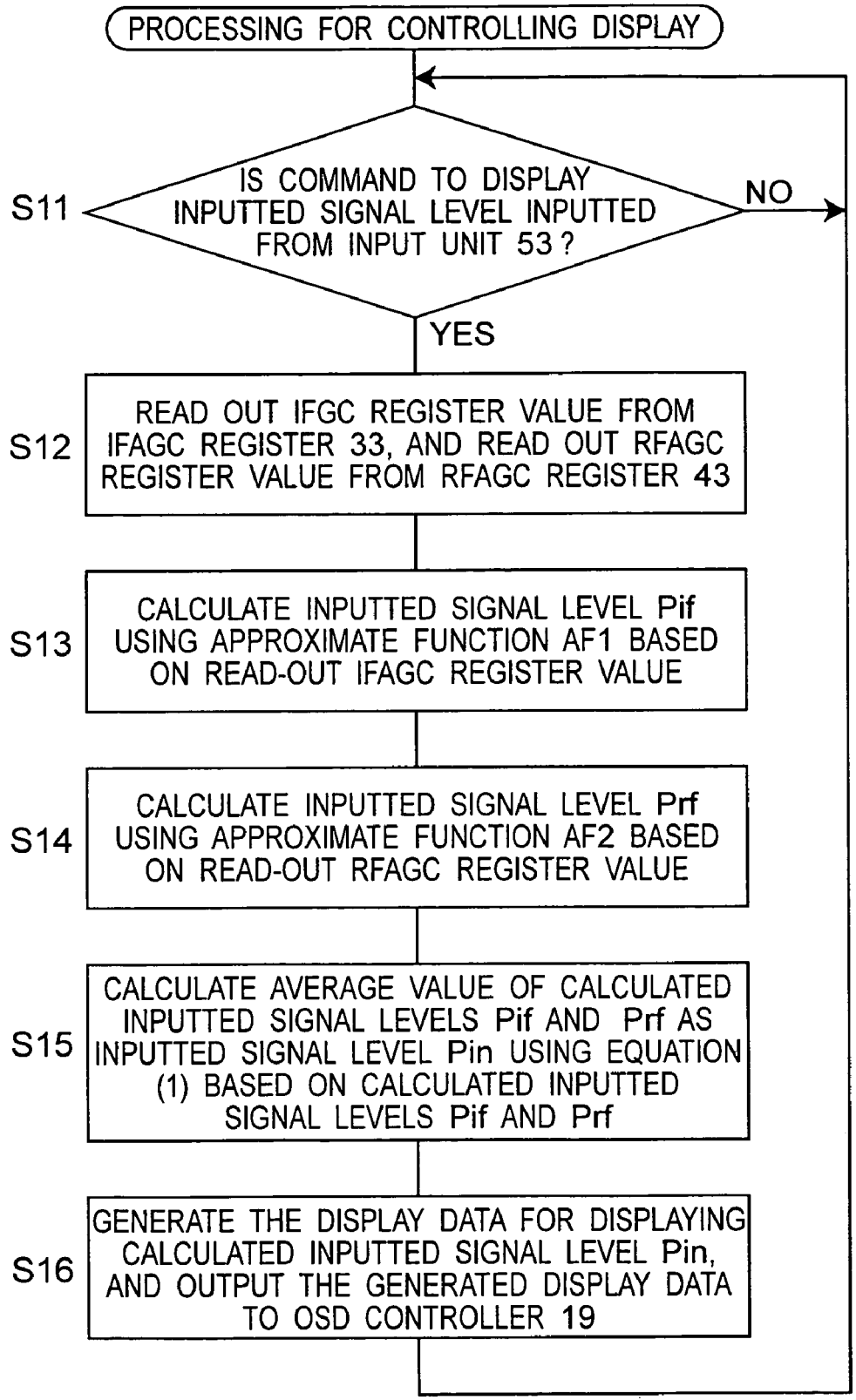
FIG. 5 is a flowchart showing a processing for controlling display, which is executed by a controller 50 shown in FIG. 1.

FIG. 5 is a flowchart showing a processing for controlling display, which is executed by the controller 50 shown in FIG. 1.

Referring to FIG. 5, at step S11, the controller 50 judges whether or not a command to display the inputted signal level is inputted from the input unit 53. If YES at step S11, the processing flow goes to step S12. If NO at step S11, the processing flow returns to step S11. Then, at step S12, the controller 50 reads out the IFAGC register value from the IFAGC register 33 and reads out the RFAGC register value from the RFAGC register value 43. At step S13, the controller 50 calculates the inputted signal level Pif using the approximate function AF1 based on the read-out IFAGC register value. At step S14, the controller 50 calculates the inputted signal level Prf using the approximate function AF2 based on the read-out RFAGC register value. Further, at step S15, the controller 50 calculates an average value of the calculated inputted signal levels Pif and Prf as the inputted signal level Pin using the following equation (1) based on the calculated inputted signal levels Pif and Prf:

$$Pin=(Pif+Prf)/2 \qquad (1).$$

Further, at step S16, the controller 50 generates display data for displaying the calculated inputted signal level Pin, and outputs the generated display data to the OSD controller 19. The processing flow then returns to step S11.

Figure 6:
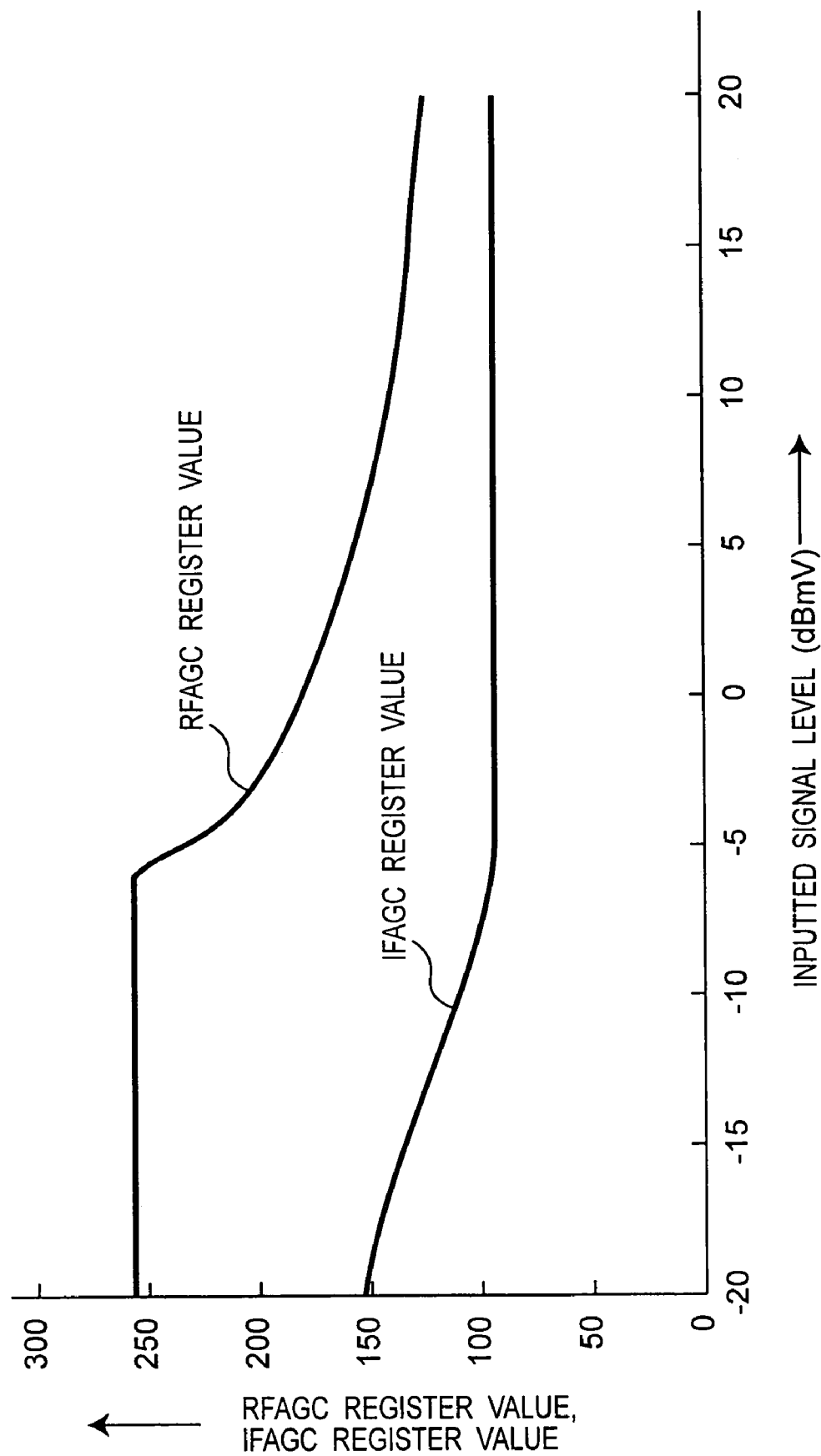
FIG. 6 is a graph showing an example of measurement results of an RFAGC register value and an IFAGC register value relative to an inputted signal level in the television receiver 100 shown in FIG. 1.

FIG. 6 is a graph showing an example of measurement results of the RFAGC register value and the IFAGC register value relative to the inputted signal level in the television receiver 100 shown in FIG. 1. As apparent from FIG. 6, there is such a characteristic that, with increasing of the inputted signal level, the RFAGC register value is substantially constant relative to the inputted signal level of up to about −6 dBmV at which level the attenuation amount of the attenuator 4 becomes the minimum and an RF gain is set to the maximum thereof, and gradually decreases relative to the inputted signal level of greater than about −6 dBmV. On the other hand, there is such a characteristic that, with increasing of the inputted signal level, the IFAGC register value gradually decreases relative to the inputted signal level of up to about −6 dBmV, and being constant relative to the inputted signal level of greater than about −6 dBmV.

Figure 7:
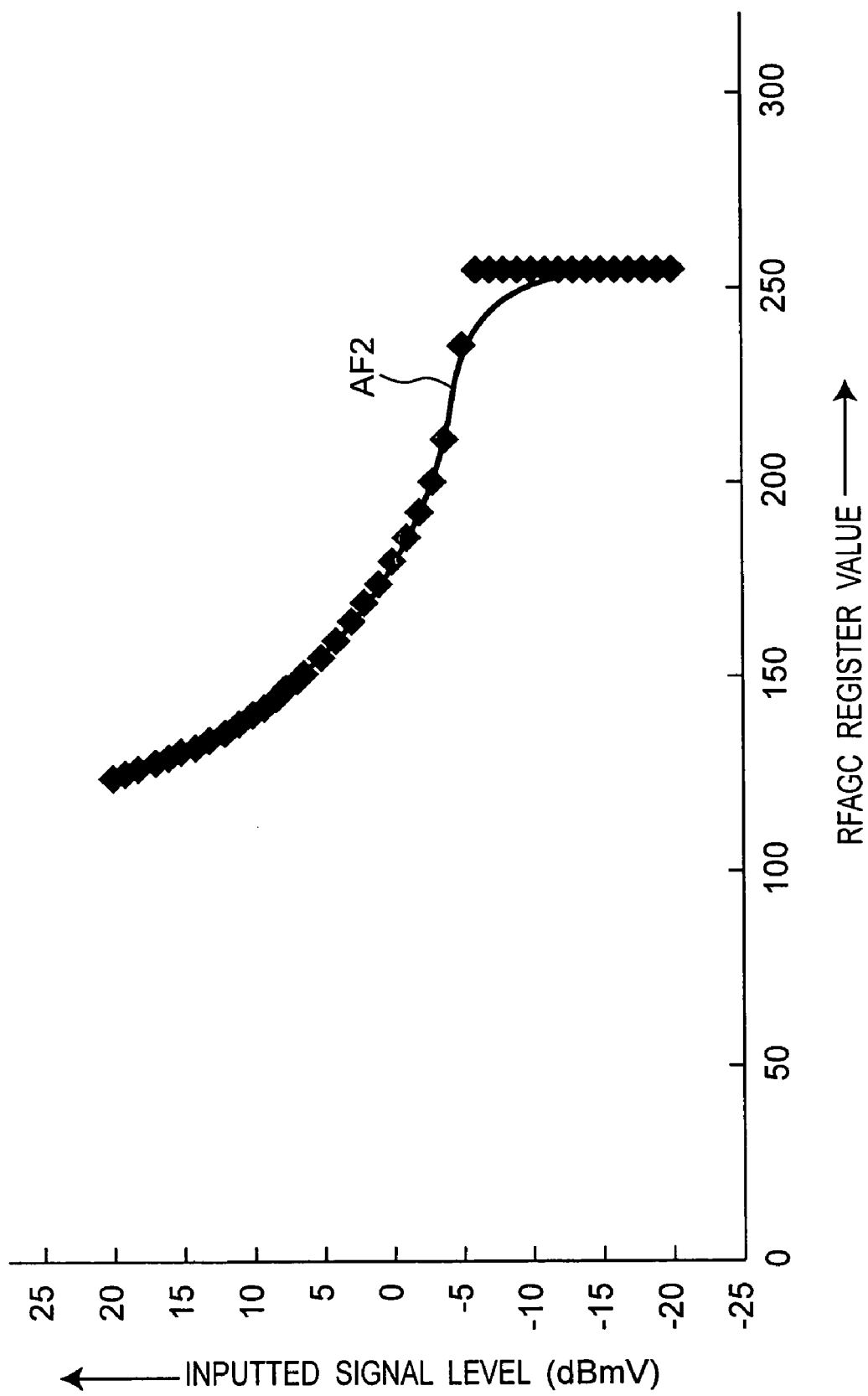
FIG. 7 is a graph showing an approximate function obtained by approximating measurement results of a relationship of the inputted signal level to the RFAGC register value shown in FIG. 6 by using a predetermined approximate function.

FIG. 7 is a graph showing an approximate function AF2 obtained by approximating the measurement results of the relationship of the inputted signal level to the RFAGC register value shown in FIG. 6 by using a predetermined approximate function. As apparent from FIG. 7, although there is a slight error between the measured values and the approximate function AF2 in a range of the inputted signal level from −5 dBmV to −10 dBmV, the obtained approximate function AF2 generally coincides with the measured values in the other range.

Figure 8:
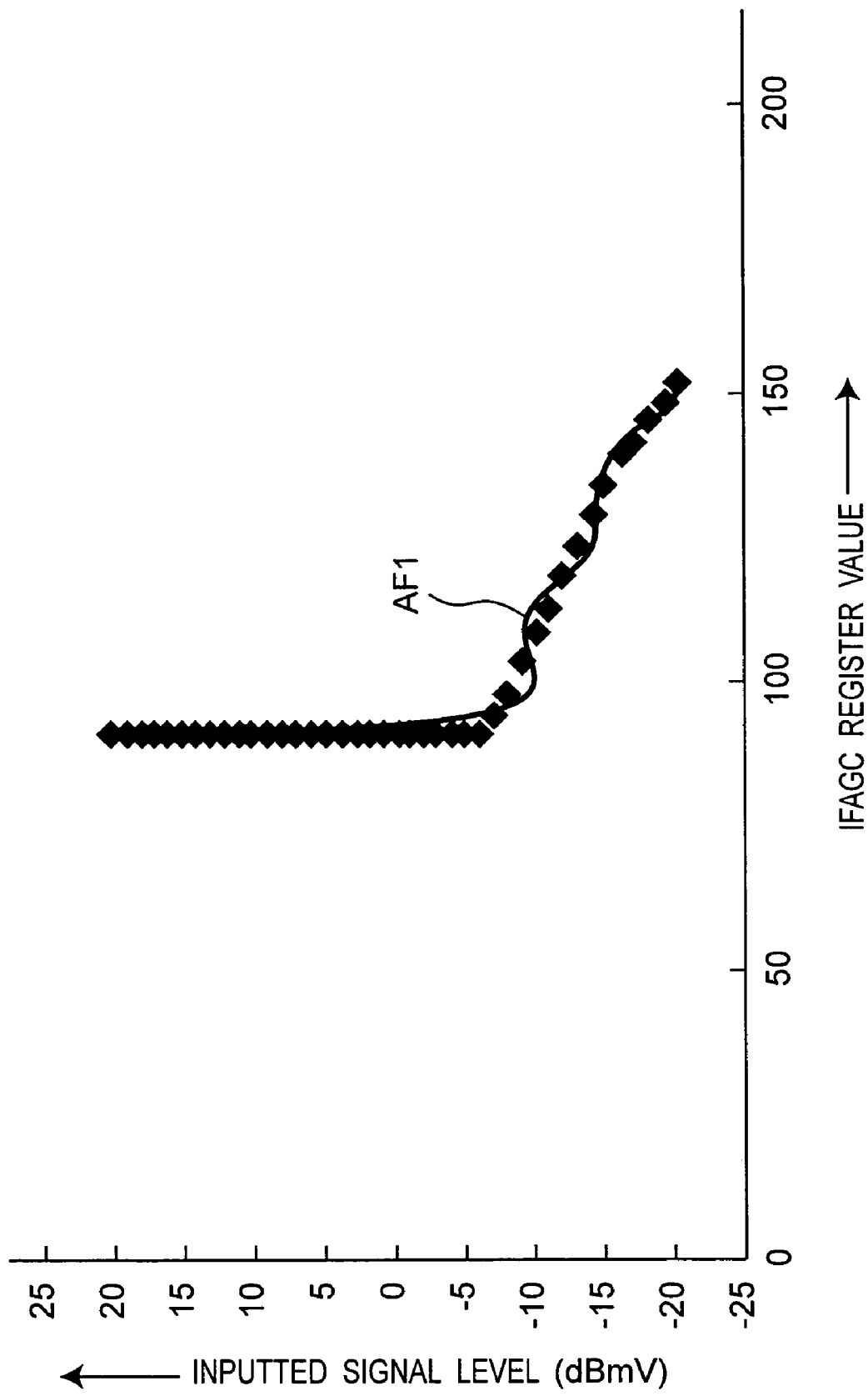
FIG. 8 is a graph showing an approximate function obtained by approximating measurement results of a relationship of the inputted signal level to the IFAGC register value shown in FIG. 6 by using a predetermined approximate function.

FIG. 8 is a graph showing an approximate function AF1 obtained by approximating the measurement results of the relationship of the inputted signal level to the IFAGC register value shown in FIG. 6 by using a predetermined approximate function. As apparent from FIG. 8, although there is a slight error between the measured values and the approximate function AF1 in a range of the inputted signal level from −10 dBmV to −0 dBmV, the obtained approximate function AF1 generally coincides with the measured values in the other range.

As described so far, in the processing for controlling display shown in FIG. 5 according to the first preferred embodiment, when the user views and listens to the digital broadcasting signal, the inputted signal level Pif is calculated using the approximate function AF1 based on the IFAGC register value, the inputted signal level Prf is calculated using the approximate function AF2 based on the RFAGC register value, and the average value of the inputted signal levels Pif and Prf is calculated and displayed as the inputted signal level Pin. Therefore, it is possible to average the errors shown in FIGS. 7 and 8 described above, and detect and display the inputted signal level of the received broadcasting signal with accuracy higher than that of the prior art.

Second Preferred Embodiment

Figure 9:
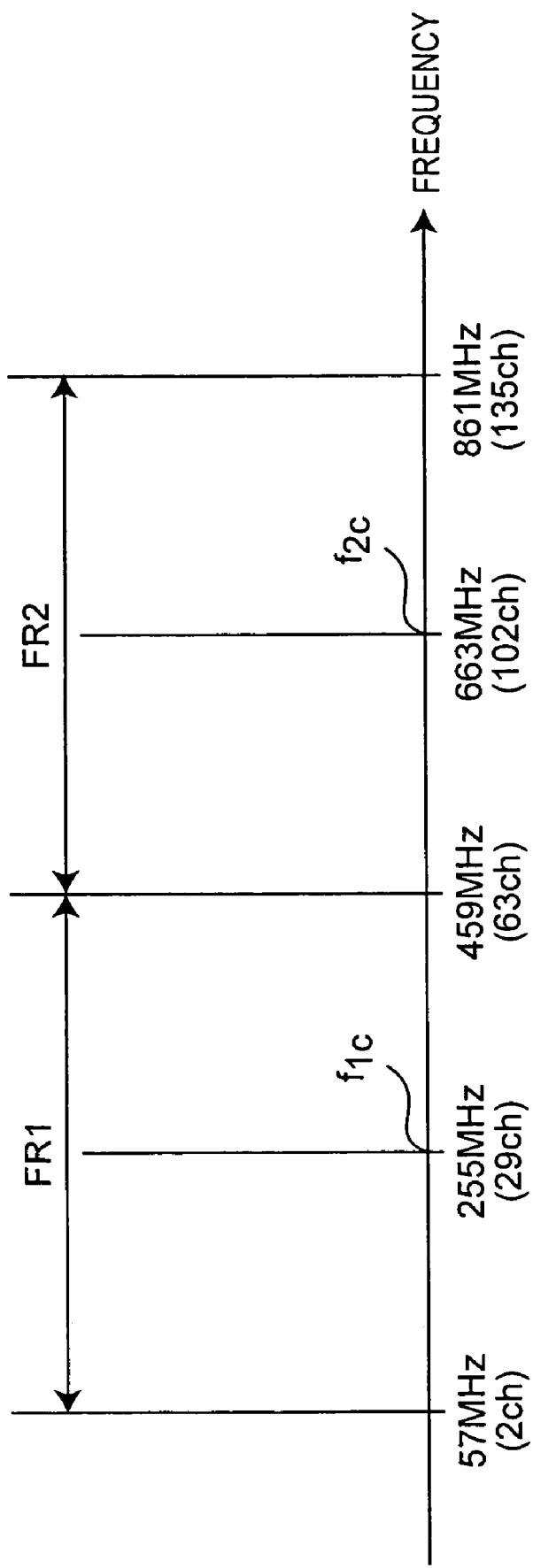
FIG. 9 is a figure showing frequency ranges FR1 and FR2 that are obtained by dividing a frequency range of a broadcasting signal into two ranges and used in a television receiver 100 according to a second preferred embodiment of the present invention.

FIG. 9 is a figure showing frequency ranges FR1 and FR2 that are obtained by dividing a frequency range of a broadcasting signal into two ranges and used in a television receiver 100 according to a second preferred embodiment of the present invention. The second preferred embodiment is characterized as follows. If an inputted signal level of a digital broadcasting signal is to be detected, attention is paid to a fact that the characteristic shown in FIG. 6 is changed according to the frequency of the broadcasting signal, and a frequency range including all channels of CATV broadcasting signals is divided into two ranges, i.e., a first frequency range FR1 and a second frequency range FR2 as shown in FIG. 9. An approximate function AF11 representing a relationship between the inputted signal level and an IFAGC register value and an approximate function AF12 representing a relationship between the inputted signal level and an RFAGC register value at a general central frequency $f_{1c}$ in the first frequency range FR1, and an approximate function AF21 representing a relationship between the inputted signal level and the IFAGC register value and an approximate function AF22 representing a relationship between the inputted signal level and the RFAGC register value at a general central frequency $f_{2c}$ in the second frequency range FR2 are calculated. Inputted signal levels Pif and Prf are calculated using the two approximate functions of a corresponding frequency range in which a channel that user views and listens to is included. Thereafter, similarly to the first preferred embodiment, these inputted signal levels Pif and Prf are averaged to calculate an inputted signal level Pin.

Figure 10:
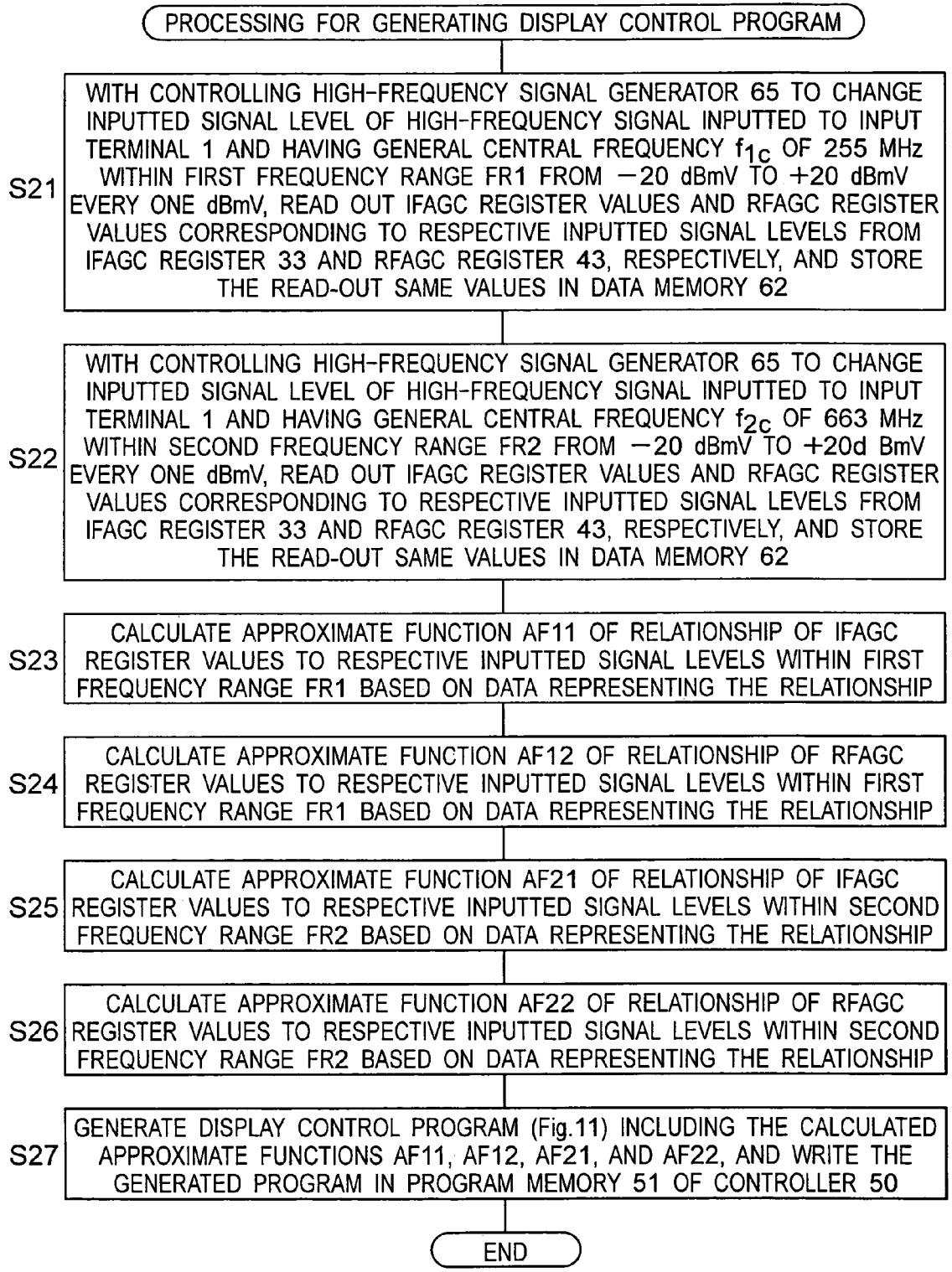
FIG. 10 is a flowchart showing a processing for generating a display control program, which is executed by a controller 60 of a measurement control system according to the second preferred embodiment.

FIG. 10 is a flowchart showing a processing for generating a display control program, which is executed by a controller 60 of a measurement control system according to the second preferred embodiment.

Referring to FIG. 10, at step S21, with controlling a high-frequency signal generator 65 to change the inputted signal level of the high-frequency signal inputted to an input terminal 1 and having the general central frequency $f_{1c}$ of 255 MHz within the first frequency range FR1 from −20 dBmV to +20 dBmV every one dBmV, the controller 60 reads out IFAGC register values and RFAGC register values corresponding to the respective inputted signal levels from an IFAGC register 33 and an RFAGC register 43, respectively, and stores the read-out same values in a data memory 62. Next, at step S22, with controlling the high-frequency signal generator 65 to change the inputted signal level of the high-frequency signal inputted to the input terminal 1 and having the general central frequency $f_{2c}$ of 663 MHz within the second frequency range FR2 from −20 dBmV to +20 dBmV every one dBmV, the controller 60 reads out IFAGC register values and RFAGC register values corresponding to the respective inputted signal levels from the IFAGC register 33 and the RFAGC register 43, respectively, and stores the read-out same values in the data memory 62. Then, at step S23, the controller 60 calculates the approximate function AF11 of the relationship of the IFAGC register values to the respective inputted signal levels within the first frequency range FR1 based on the data representing the relationship. At step S24, the controller 60 calculates the approximate function AF12 of the relationship of the RFAGC register values to the respective inputted signal levels within the first frequency range FR1 based on the data representing the relationship. Further, at step S25, the controller 60 calculates the approximate function AF21 of the relationship of the IFAGC register values to the respective inputted signal levels within the second frequency range FR2 based on the data representing the relationship. At step S26, the controller 60 calculates the approximate function AF22 of the relationship of the RFAGC register values to the respective inputted signal levels within the second frequency range FR2 based on the data representing the relationship. Further, at step S27, the controller 60 generates a display control program (FIG. 11) including the calculated approximate functions AF11, AF12, AF21, and AF22, and writes the generated display control program into the program memory 51 of the controller 50, thus finishing the processing for generating the display control program.

Figure 11:
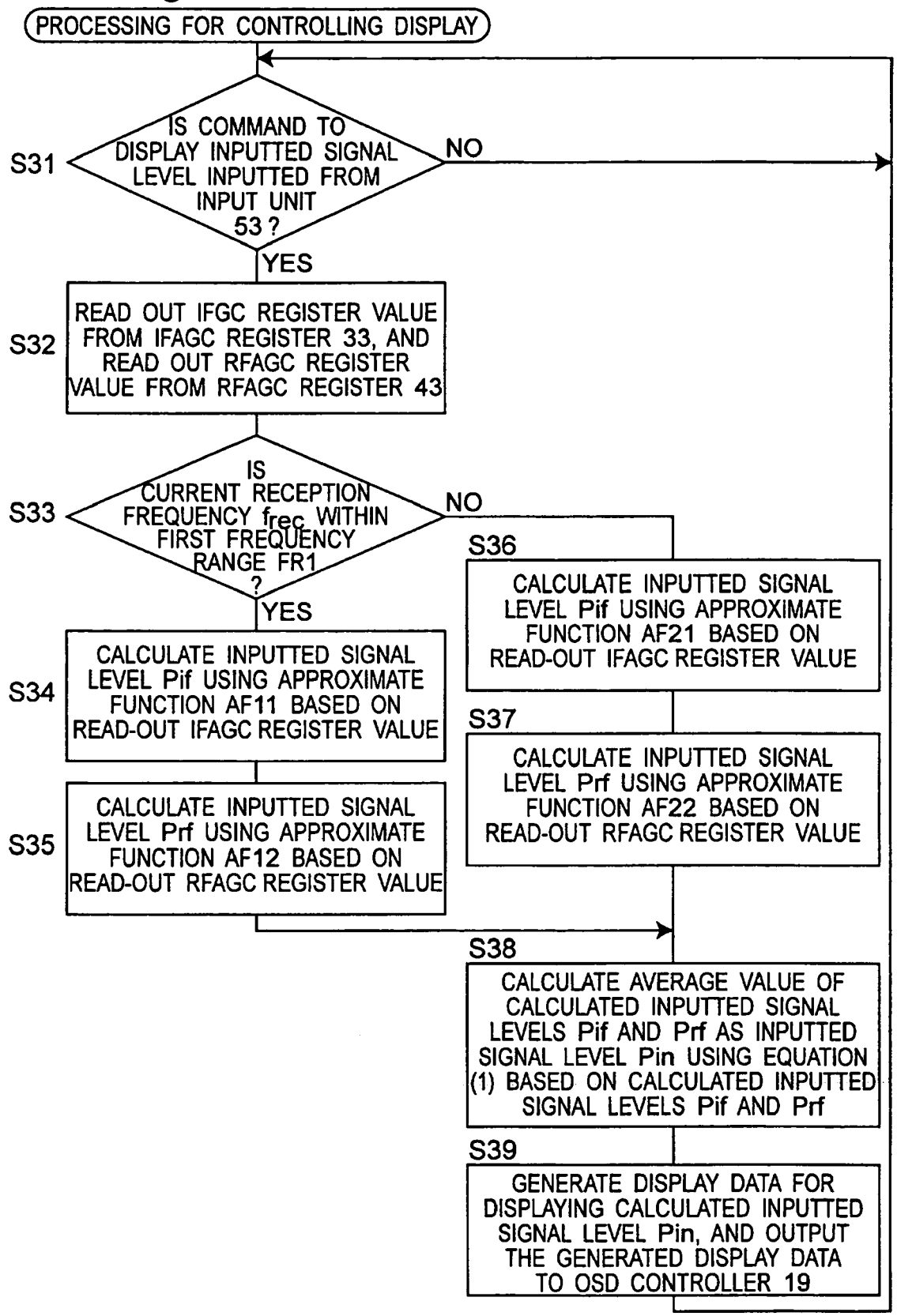
FIG. 11 is a flowchart showing a processing for controlling display, which is executed by a controller 50 according to the second preferred embodiment.

FIG. 11 is a flowchart showing a processing for controlling display, which is executed by a controller 50 according to the second preferred embodiment.

Referring to FIG. 11, at step S31, the controller 50 judges whether or not a command to display the inputted signal level is inputted from an input unit 53. If YES at step S31, the processing flow goes to step S32. If NO at step S31, the processing flow returns to step S31. At step S32, the controller 50 reads out the IFAGC register value from the IFAGC register 33 and reads out the RFAGC register value from the RFAGC register value 43. Next, at step S33, the controller 50 judges whether or not a current reception frequency $f_{rec}$ is fallen within the first frequency range FR1. If YES at step S22, the processing flow goes to step S34. If NO at step S22, the processing flow goes-to step S36. At step S34, the controller 50 calculates the inputted signal level Pif using the approximate function AF11 based on the read-out IFAGC register value. At step S35, the controller 50 calculates the inputted signal level Prf using the approximate function AF12 based on the read-out RFAGC register value, and the processing flow goes to step S38. On the other hand, at step S36, the controller 50 calculates the inputted signal level Pif using the approximate function AF21 based on the read-out IFAGC register value. At step S37, the controller 50 calculates the inputted signal level Prf using the approximate function AF22 based on the read-out RFAGC register value, and the processing flow goes to step S38. Further, at step S38, the controller 50 calculates an average value of the calculated inputted signal levels Pif and Prf as the inputted signal level Pin using the equation (1) based on the calculated inputted signal levels Pif and Prf. At step S39, the controller 50 generates display data for displaying the calculated inputted signal level Pin, and outputs the generated display data to an OSD controller 19. The processing flow then returns to step S31.

As described so far, in the processing for controlling display shown in FIG. 11 according to the second preferred embodiment, when the user views and listens to the digital broadcasting signal, the inputted signal level Pif is calculated using the approximate function AF11 or AF21 corresponding to the frequency range FR1 or FR2 included in the frequency of the viewed digital broadcasting signal based on the IFAGC register value, the inputted signal level Prf is calculated using the approximate function AF12 or AF22 corresponding to the frequency range FR1 or FR2 included in the frequency of the viewed digital broadcasting signal based on the RFAGC register value, and the average value of the inputted signal levels Pif and Prf is calculated and displayed as the inputted signal level Pin. Therefore, it is possible to average the errors shown in FIGS. 7 and 8 described above, substantially eliminate the error due to the change in the frequency of the broadcasting signal, and detect and display the inputted signal level of the received broadcasting signal with accuracy higher than that of the prior art.

In the preferred embodiment stated above, the frequency range of the broadcasting signal is divided into the two frequency ranges FR1 and FR2. Alternatively, the frequency range may be divided into three or more frequency ranges and approximate functions may be calculated. The same thing is true for the subsequent preferred embodiments.

Third Preferred Embodiment

Figure 12:
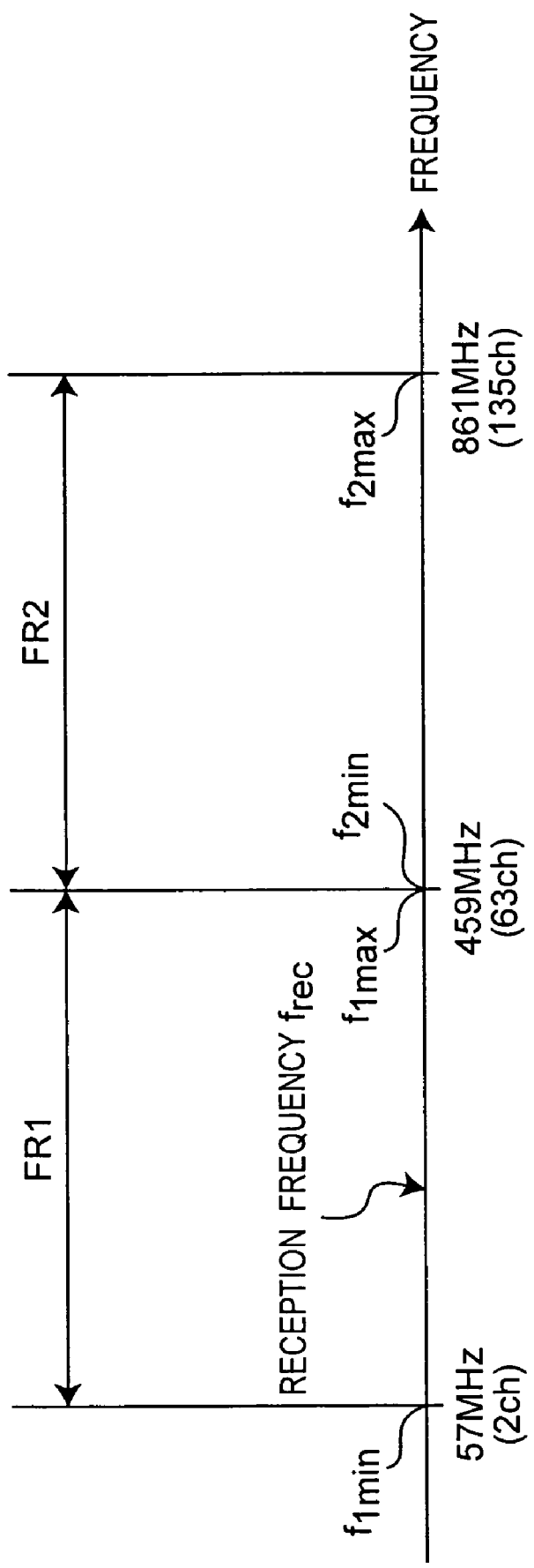
FIG. 12 is a figure showing minimum frequencies $f_{1min}$ and $f_{2min}$, maximum frequencies $f_{1max}$ and $f_{2max}$ in respective frequency ranges FR1 and FR2 obtained by dividing a frequency range into two ranges, and a reception frequency $f_{rec}$, which are used in a television receiver 100 according to a third preferred embodiment of the present invention.

FIG. 12 is a figure showing minimum frequencies $f_{1min}$ and $f_{2min}$, maximum frequencies $f_{1max}$ and $f_{2max}$ in respective frequency ranges FR1 and FR2 obtained by dividing a frequency range into two ranges, and a reception frequency $f_{rec}$, which are used in a television receiver 100 according to a third preferred embodiment of the present invention. The third preferred embodiment is characterized as follows. If an inputted signal level of a digital broadcasting signal is to be detected, attention is paid to a fact that the characteristic shown in FIG. 6 is changed according to a frequency of the broadcasting signal, and the frequency range of all channels of CATV broadcasting signals is divided into the two ranges, i.e., the first frequency range FR1 and the second frequency range FR2 as shown in FIG. 12. In addition, the following approximate functions are calculated.

(a) An approximate function AF31a representing a relationship between the inputted signal level and an IFAGC register value and an approximate function AF31b representing a relationship between the inputted signal level and an RFAGC register value at the minimum frequency $f_{1min}$ in the first frequency range FR1.

(b) An approximate function AF32a=AF41a representing a relationship between the inputted signal level and the IFAGC register value and an approximate function AF32b=AF41b representing a relationship between the inputted signal level and the RFAGC register value at each of the maximum frequency $f_{1max}$ in the first frequency range FR1 and the minimum frequency $f_{2min}$ the second frequency range FR2.

(c) An approximate function AF42a representing a relationship between the inputted signal level and the IFAGC register value and an approximate function AF42b representing a relationship between the inputted signal level and the RFAGC register value at the maximum frequency $f_{2max}$ in the second frequency range FR2.

Further, at each of the minimum frequency and the maximum frequency of a frequency range in which a channel that user views and listens to is included, inputted signal levels Pif and Prf are calculated using the two corresponding approximate-functions, and similarly to the first preferred embodiment, these inputted signal levels Pif and Prf are averaged to calculate average values $P_{fmin}$ and $P_{fmax}$ of the inputted signal levels at the minimum frequency and the maximum frequency in this frequency range, respectively. Further, based on the calculated inputted signal level average values $P_{fmin}$ and $P_{fmax}$, an inputted signal level Pin is calculated using the following equation (2) by a linear approximation method for linearly approximating the inputted signal level relative to a reception frequency on assumption that the inputted signal level is linearly changed relative to a frequency between the minimum frequency and the maximum frequency in a predetermined frequency range:

$$Pin = \frac{f_{rec} - f_{nmin}}{f_{nmax} - f_{nmin}} \times P_{fmax} + \frac{f_{nmax} - f_{rec}}{f_{nmax} - f_{nmin}} \times P_{fmin}. \qquad (2)$$

In this case, $f_{rec}$ denotes a reception frequency, n is one in the first frequency range FR1 and two in the second frequency range FR2.

Figure 13:
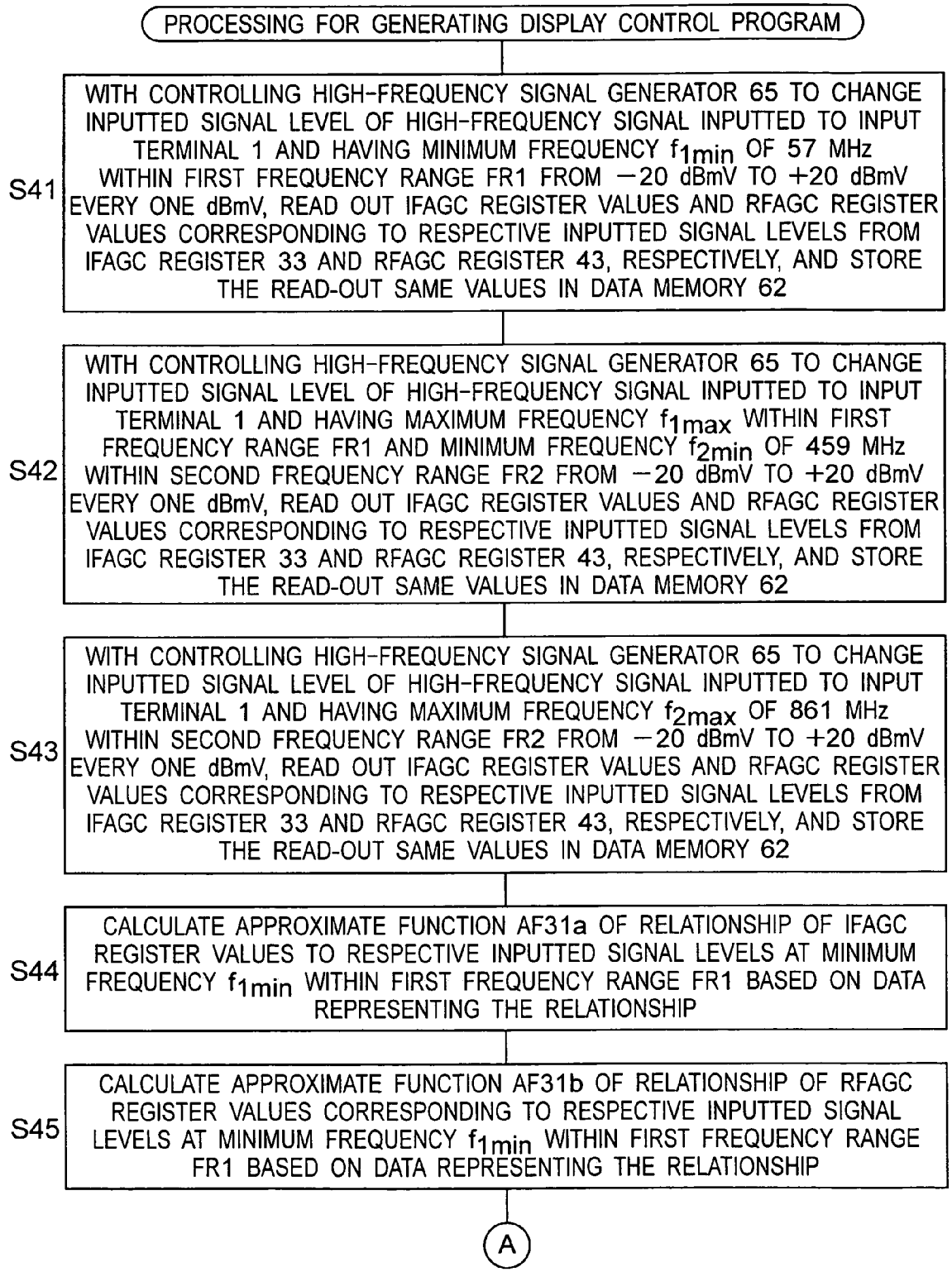
FIG. 13 is a flowchart showing a first part of a processing for generating a display control program, which is executed by a controller 60 of a measurement control system according to the third preferred embodiment.
Figure 14:
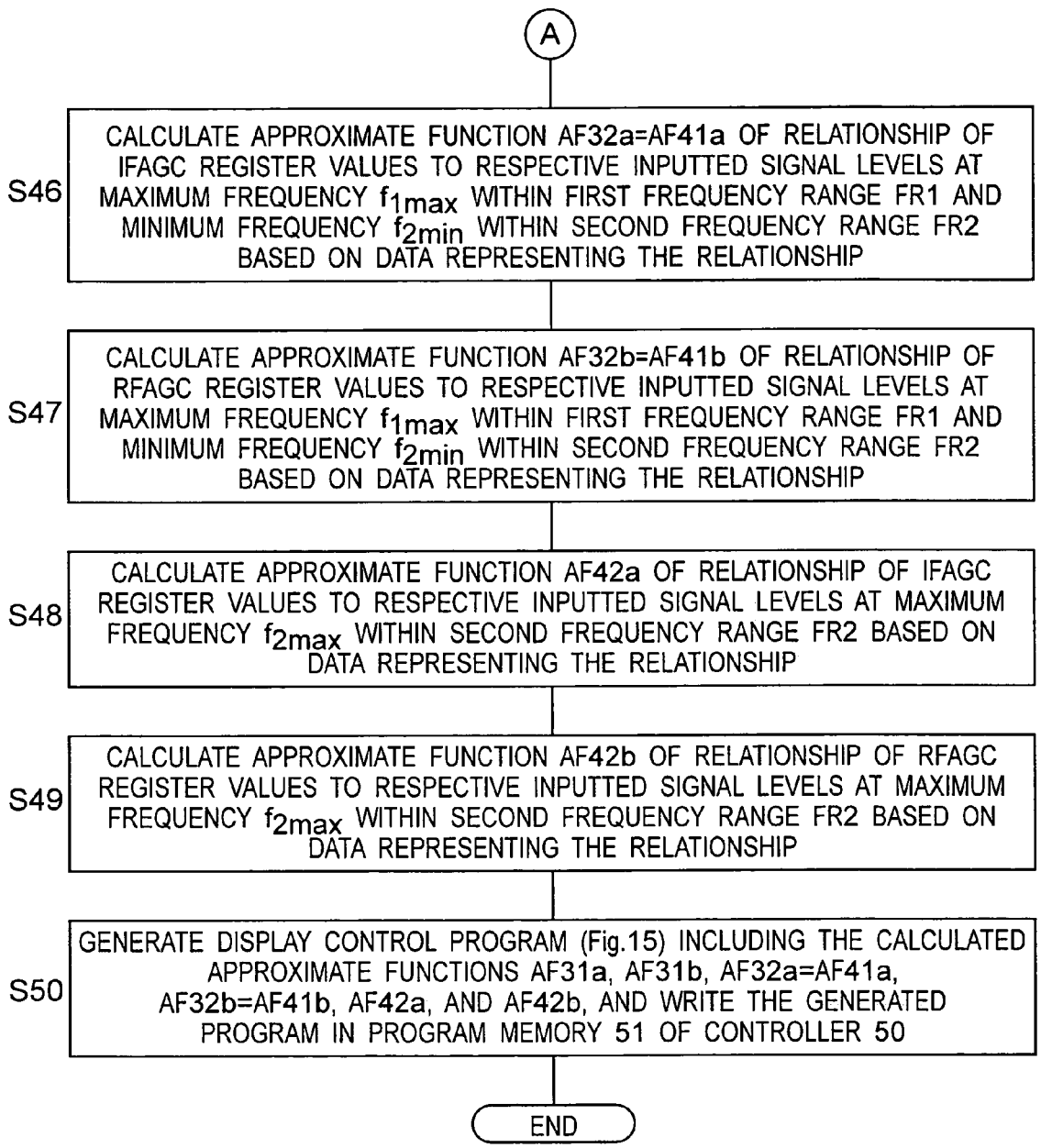
FIG. 14 is a flowchart showing a second part of a processing for generating a display control program, which is executed by a controller 60 of a measurement control system according to the third preferred embodiment.

FIGS. 13 and 14 are flowcharts showing a processing for generating a display control program, which is executed by a controller 60 of a measurement control system according to the third preferred embodiment.

Referring to FIG. 13, at step S41, with controlling a high-frequency signal generator 65 to change the inputted signal level of the high-frequency signal inputted to an input terminal 1 and having the minimum frequency $f_{1min}$ of 57 MHz within the first frequency range FR1 from −20 dBmV to +20 dBmV every one dBmV, the controller 60 reads out IFAGC register values and RFAGC register values corresponding to the respective inputted signal levels from an IFAGC register 33 and an RFAGC register 43, respectively, and stores the read-out same values in a data memory 62. Next, at step S42, with controlling the high-frequency signal generator 65 to change the inputted signal level of the high-frequency signal inputted to the input terminal 1 and having the maximum frequency $f_{1max}$ of 459 MHz within the first frequency range FR1 and the minimum frequency $f_{2min}$ of 459 MHz within the second frequency range FR2 from −20 dBmV to +20 dBmV every one dBmV, the controller 60 reads out IFAGC register values and RFAGC register values corresponding to the respective inputted signal levels from the IFAGC register 33 and the RFAGC register 43, respectively, and stores the read-out same values in the data memory 62. Further, at step S43, with controlling the high-frequency signal generator 65 to change the inputted signal level of the high-frequency signal inputted to the input terminal 1 and having the maximum frequency $f_{2max}$ of 861 MHz within the second frequency range FR2 from −20 dBmV to +20 dBmV every one dBmV, the controller 60 reads out IFAGC register values and RFAGC register values corresponding to the inputted signal levels from the IFAGC register 33 and the respective RFAGC register 43, respectively, and stores the read-out same values in the data memory 62. Then, at step S44, the controller 60 calculates the approximate function AF31a of the relationship of the IFAGC register values to the respective inputted signal levels at the minimum frequency $f_{min}$ within the first frequency range FR1 based on the data representing the relationship. At step S45, the controller 60 calculates the approximate function AF31b of the relationship of the RFAGC register values to the respective inputted signal levels at the minimum frequency $f_{1min}$ within the first frequency range FR1 based on the data representing the relationship. The processing flow goes to step S46 shown in FIG. 14.

At step S46 shown in FIG. 14, the controller 60 calculates the approximate function AF32a=AF41a of the relationship of the IFAGC register values to the respective inputted signal levels at the maximum frequency $f_{1max}$ in the first frequency range FR1 and at the minimum frequency $f_{2min}$ within the second frequency range FR2 based on the data representing the relationship. At step S47, the controller 60 calculates the approximate function AF32b=AF41b for the relationship of the RFAGC register values to the respective inputted signal levels at the maximum frequency $f_{1max}$ within the first frequency range FR1 and at the minimum frequency $f_{2min}$ in the second frequency range FR2 based on the data representing the relationship. Next, at step S48, the controller 60 calculates the approximate function AF42a of the relationship of the IFAGC register values to the respective inputted signal levels at the maximum frequency $f_{2max}$ within the second frequency range FR2 based on the data representing the relationship. At step S49, the controller 60 calculates the approximate function AF42b for the relationship of the RFAGC register values to the respective inputted signal levels at the maximum frequency $f_{2max}$ within the second frequency range FR2 based on the data representing the relationship. Further, at step S50, the controller 60 generates a display control program (FIG. 15) including the calculated approximate functions AF31a, AF31b, AF32a=AF41a, AF32b=AF41b, AF42a, and AF42b, and writes the generated display control program in the program memory 51 of the controller 50, thus finishing the processing for generating the display control program.

Figure 15:
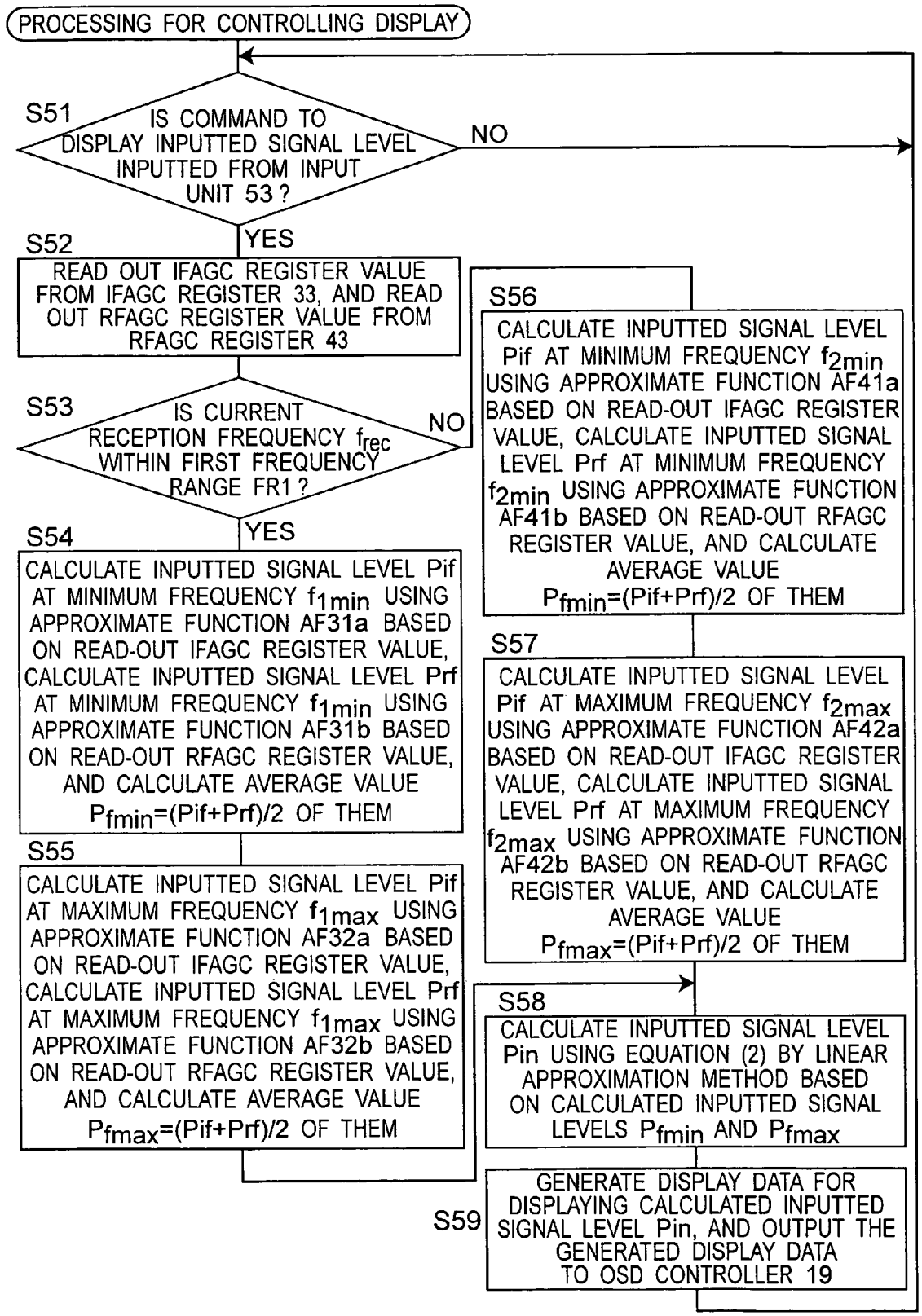
FIG. 15 is a flowchart showing a processing for controlling display, which is executed by a controller 50 according to the third preferred embodiment.

FIG. 15 is a flowchart showing a processing for controlling display, which is executed by a controller 50 according to the third preferred embodiment.

Referring to FIG. 15, at step S51, the controller 50 judges whether or not a command to display the inputted signal level is inputted from an input unit 53. If YES at step S51, the processing flow goes to step S52. If NO at step S51, the processing flow returns to step S51. At step S52, the controller 50 reads out the IFAGC register value from the IFAGC register 33 and reads out the RFAGC register value from the RFAGC register value 43. Next, at step S53, the controller 50 judges whether or not a current reception frequency $f_{rec}$ is fallen within the first frequency range FR1. If YES at step S53, the processing flow goes to step S54. If NO at step S53, the processing flow goes to step S56.

At step S54, the controller 50 calculates the inputted signal level Pif at the minimum frequency $f_{1min}$ using the approximate function AF31a based on the read-out IFAGC register value. The controller 50 calculates the inputted signal level Prf at the minimum frequency $f_{1min}$ using the approximate function AF31b based on the read-out RFAGC register value. In addition, the controller 50 calculates the average value $P_{fmin}$=(Pif+Prf)/2 of them. Next, at step S55, the controller 50 calculates the inputted signal level Pif at the maximum frequency $f_{1max}$ using the approximate function AF32a based on the read-out IFAGC register value. The controller 50 calculates the inputted signal level Prf at the maximum frequency $f_{1max}$ using the approximate function AF32b based on the read-out RFAGC register value. In addition, the controller 50 calculates the average value $P_{fmax}$=(Pif+Prf)/2 of them. Thereafter, the processing flow goes to step S58.

At step S56, the controller 50 calculates the inputted signal level Pif at the minimum frequency $f_{2min}$ using the approximate function AF41a based on the read-out IFAGC register value. The controller 50 calculates the inputted signal level Prf at the minimum frequency $f_{2min}$ using the approximate function AF41b based on the read-out RFAGC register value. In addition, the controller 50 calculates the average value $P_{fmin}$=(Pif+Prf)/2 of them. Next, at step S57, the controller 50 calculates the inputted signal level Pif at the maximum frequency $f_{2max}$ using the approximate function AF42a based on the read-out IFAGC register value. The controller 50 calculates the inputted signal level Prf at the maximum frequency $f_{2max}$ using the approximate function AF42b based on the read-out RFAGC register value. In addition, the controller 50 calculates the average value $P_{fmax}$=(Pif+Prf)/2 of them. Thereafter, the processing flow goes to step S58.

Further, at step S58, the controller 50 calculates the inputted signal level Pin using the equation (2) by the linear approximation method based on the calculated inputted signal levels $P_{fmin}$ and $P_{fmax}$. At step S59, the controller 50 generates display data for displaying the calculated inputted signal level Pin, and outputs the generated display data to an OSD controller 19. The processing flow then returns to step S51.

As described so far, in the processing for controlling display shown in FIG. 15 according to the third preferred embodiment, when the user views and listens to the digital broadcasting signal, the inputted signal level Pif is calculated using the approximate function corresponding to the minimum frequency within the frequency range FR1 or FR2 included in the frequency of the viewed digital broadcasting signal based on the IFAGC register value. The inputted signal level Prf is calculated using the approximate function corresponding to the minimum frequency within the frequency range FR1 or FR2 included in the frequency of the viewed digital broadcasting signal based on the RFAGC register value. The average value of the inputted signal levels Pif and Prf is calculated as the inputted signal level $P_{fmin}$ of the minimum frequency. In addition, the inputted signal level Pif is calculated using the approximate function corresponding to the maximum frequency within the frequency range FR1 or FR2 included in the frequency of the viewed digital broadcasting signal based on the IFAGC register value. The inputted signal level Prf is calculated using the approximate function corresponding to the maximum frequency within the frequency range FR1 or FR2 included in the frequency of the viewed digital broadcasting signal based on the RFAGC register value. The average value of the inputted signal levels Pif and Prf is calculated as the inputted signal level $P_{fmax}$ of the maximum frequency. Using the inputted signal level $P_{fmin}$ at the minimum frequency in this frequency range and the inputted signal level $P_{fmax}$ at the maximum frequency in this frequency range, the inputted signal level Pin is calculated and displayed using the equation (2) by the linear approximation method. Therefore, it is possible to average the errors shown in FIGS. 7 and 8 described above, correct the error due to a change in the frequency of the broadcasting signal in light of a frequency deviations from the minimum frequency and the maximum frequency, and detect and display the inputted signal level of the received broadcasting signal with accuracy higher than that of the prior art.

Fourth Preferred Embodiment

Figure 16:
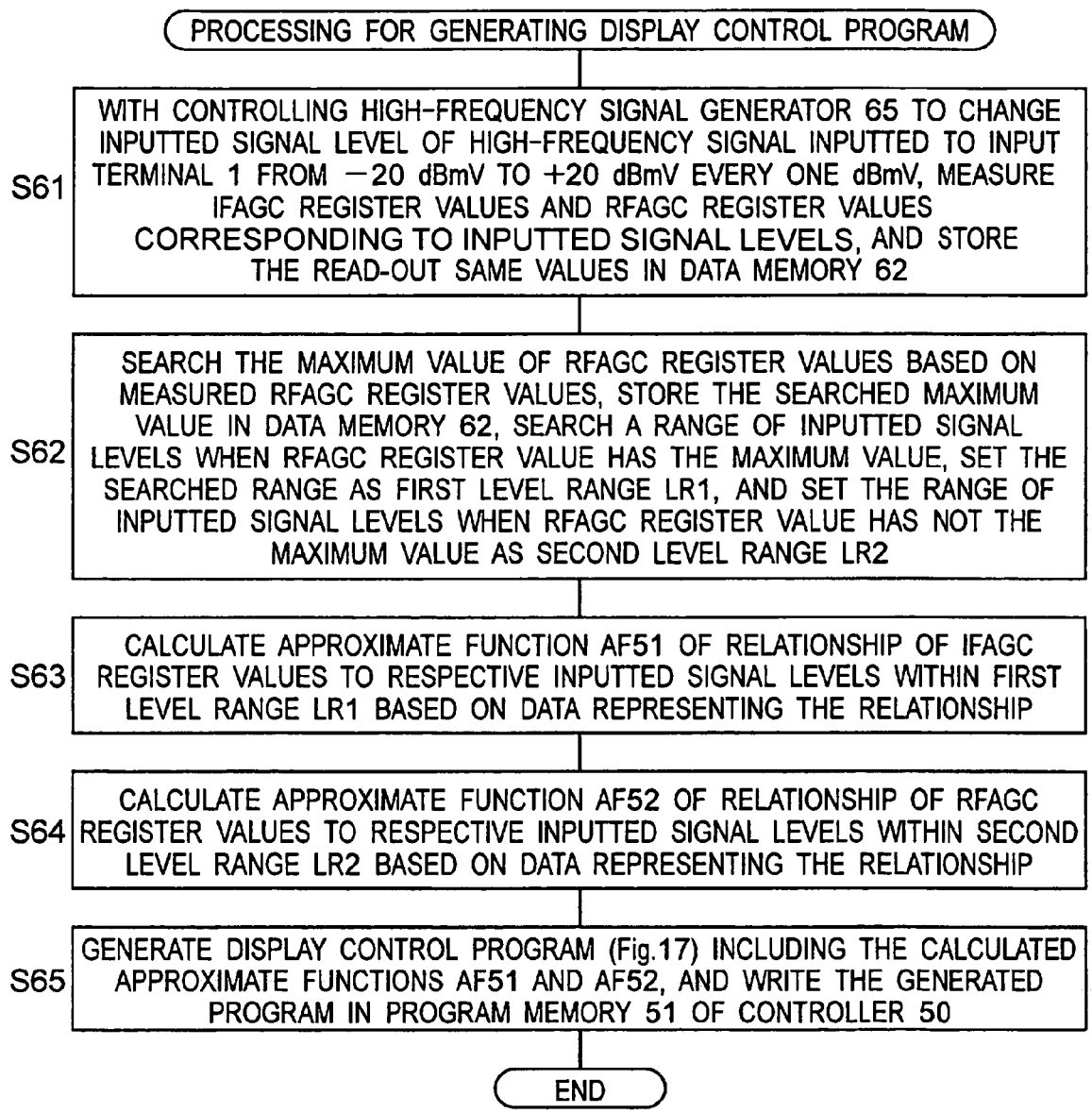
FIG. 16 is a flowchart showing a processing for generating a display control program, which is executed by a controller 60 of a measurement control system according to a fourth preferred embodiment.
Figure 17:
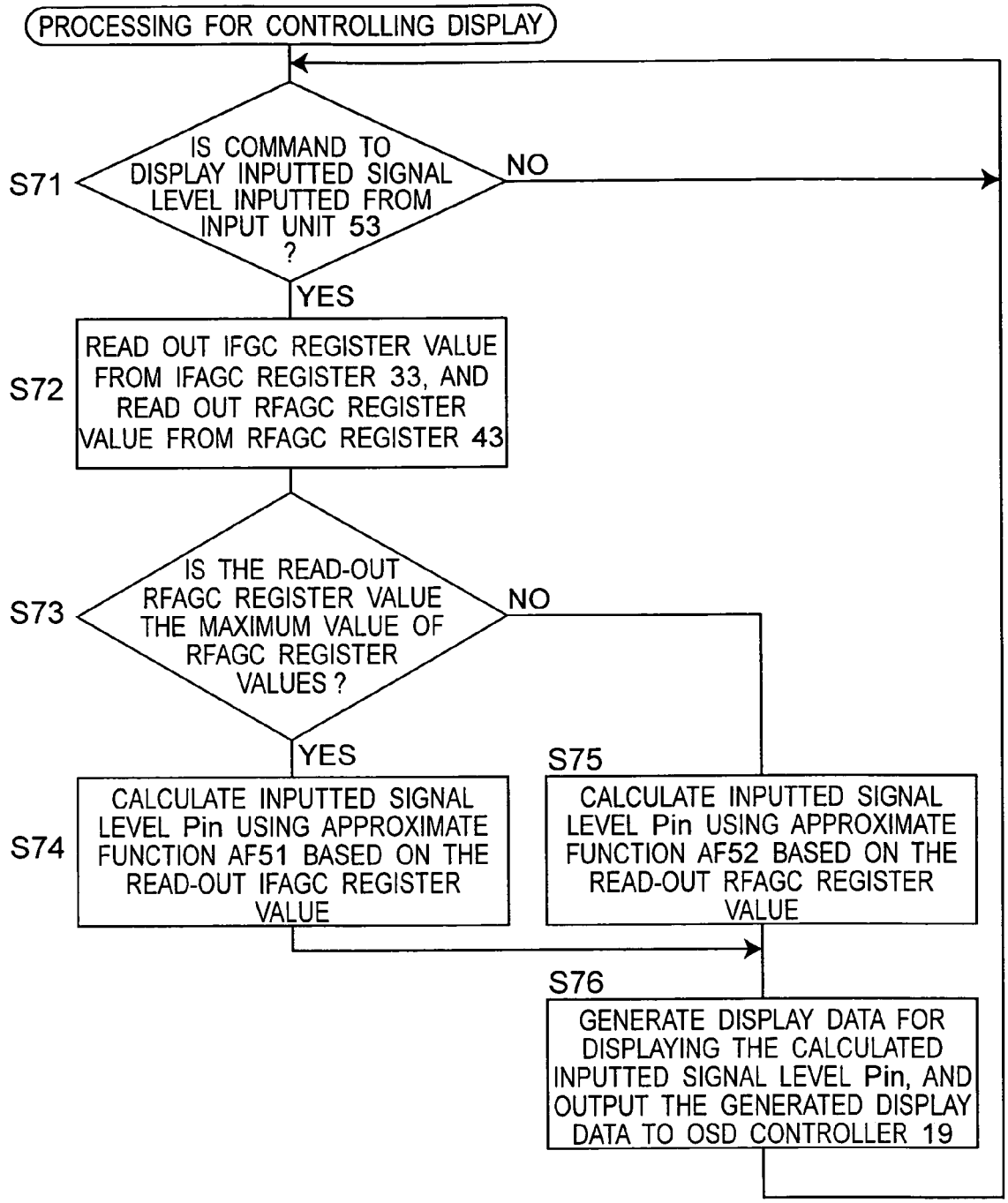
FIG. 17 is a flowchart showing a processing for controlling display, which is executed by a controller 50 according to the fourth preferred embodiment.

FIG. 16 is a flowchart showing a processing for generating a display control program, which is executed by a controller 60 of a measurement control system according to a fourth preferred embodiment. FIG. 17 is a flowchart showing a processing for controlling display, which is executed by a controller 50 according to the fourth preferred embodiment.

The fourth preferred embodiment is characterized as follows. Attention is paid to facts, as apparent from the graph of FIG. 6, that when an RFAGC register value is the maximum value thereof (when an inputted signal level is smaller than a predetermined threshold value (about −6 dBmV in FIG. 6)), only the IFAGC register value is generally changed relative to the inputted signal level and that when the IFAGC register value is not the maximum value thereof (when the inputted signal level exceeds the threshold value), only an RFAGC register value is generally changed relative to the inputted signal level. In the former case, the inputted signal level is detected based on the IFAGC register value. On the other hand, in the latter case, the inputted signal level is detected based on the RFAGC register value. Concretely, the maximum value of measured RFAGC register values is searched. A range of the inputted signal level at which the RFAGC register value is the maximum value thereof (where an attenuation amount of the attenuator 4 shown in FIG. 1 has the minimum value thereof and a gain for a high-frequency signal has the maximum value thereof) is searched, and the searched range is set as a first level range LR1. A range of the inputted signal level, at which the RFAGC register value does not have the maximum value thereof, is set as a second level range LR2. In the first level range LR1, an inputted signal level Pin is calculated using an approximate function AF51 in this range LR1 based on the IFAGC register value. On the other hand, in the second level range LR2, the inputted signal level Pin is calculated using an approximate function AF52 in this range LR2 based on the RFAGC register value.

In the processing for generating the display control program shown in FIG. 16, at step S61, with controlling a high-frequency signal generator 65 to change the inputted signal level of the high-frequency signal inputted to an input terminal 1 from −20 dBmV to +20 dBmV every one dBmV, the controller 60 measures IFAGC register values and RFAGC register values corresponding to the inputted signal levels, and stores the measured same values in a data memory 62. Next, at step S62, the controller 50 searches the maximum value of the RFAGC register values based on the measured RFAGC register values and stores the searched maximum value in the data memory 62. In addition, the controller 50 searches a range of the inputted signal level when the RFAGC register value has the maximum value thereof, and sets the searched range as the first level range LR1. The controller 50 sets a range of the inputted signal level when the RFAGC register value does not have the maximum value thereof as the second level range LR2. Then, at step S63, the controller 60 calculates the approximate function AF51 of the relationship of the IFAGC register values to the respective inputted signal levels within the first level range LR1 based on the data representing this relationship. At step S64, the controller 60 calculates the approximate function AF52 of the relationship of the RFAGC register values to the respective inputted signal levels within the second level range LR2 based on the data representing this relationship. Further, at step S65, the controller 60 generates a display control program (FIG. 17) including the calculated approximate functions AF51 and AF52, and writes the generated display control program in a program memory 51 of the controller 50, thus finishing the processing for generating the display control program.

In the processing for controlling display shown in FIG. 17, at step S71, the controller 50 judges whether or not a command to display the inputted signal level is inputted from an input unit 53. If YES at step S71, the processing flow goes to step S72. If NO at step S71, the processing flow returns to step S71. At step S72, the controller 50 reads out the IFAGC register value from an IFAGC register 33 and reads out the RFAGC register value from an RFAGC register value 43. Then, at step S73, the controller 50 judges whether or not the read-out RFAGC register value is the maximum value of the RFAGC register values. If YES at step S73, the processing flow goes to step S74. If NO at step S73, the processing flow goes to step S75. At step S74, the controller 50 calculates the inputted signal level Pin using the approximate function AF51 based on the read-out IFAGC register value. Thereafter, the processing flow goes to step S76. On the other hand, at step S75, the controller 50 calculates the inputted signal level Pin using the approximate function AF52 based on the read-out RFAGC register value. Thereafter, the processing flow goes to step S76. Further, at step S76, the controller 50 generates display data for displaying the calculated inputted signal level Pin, and outputs the generated display data to an OSD controller 19. The processing flow then returns to step S71.

Figure 18:
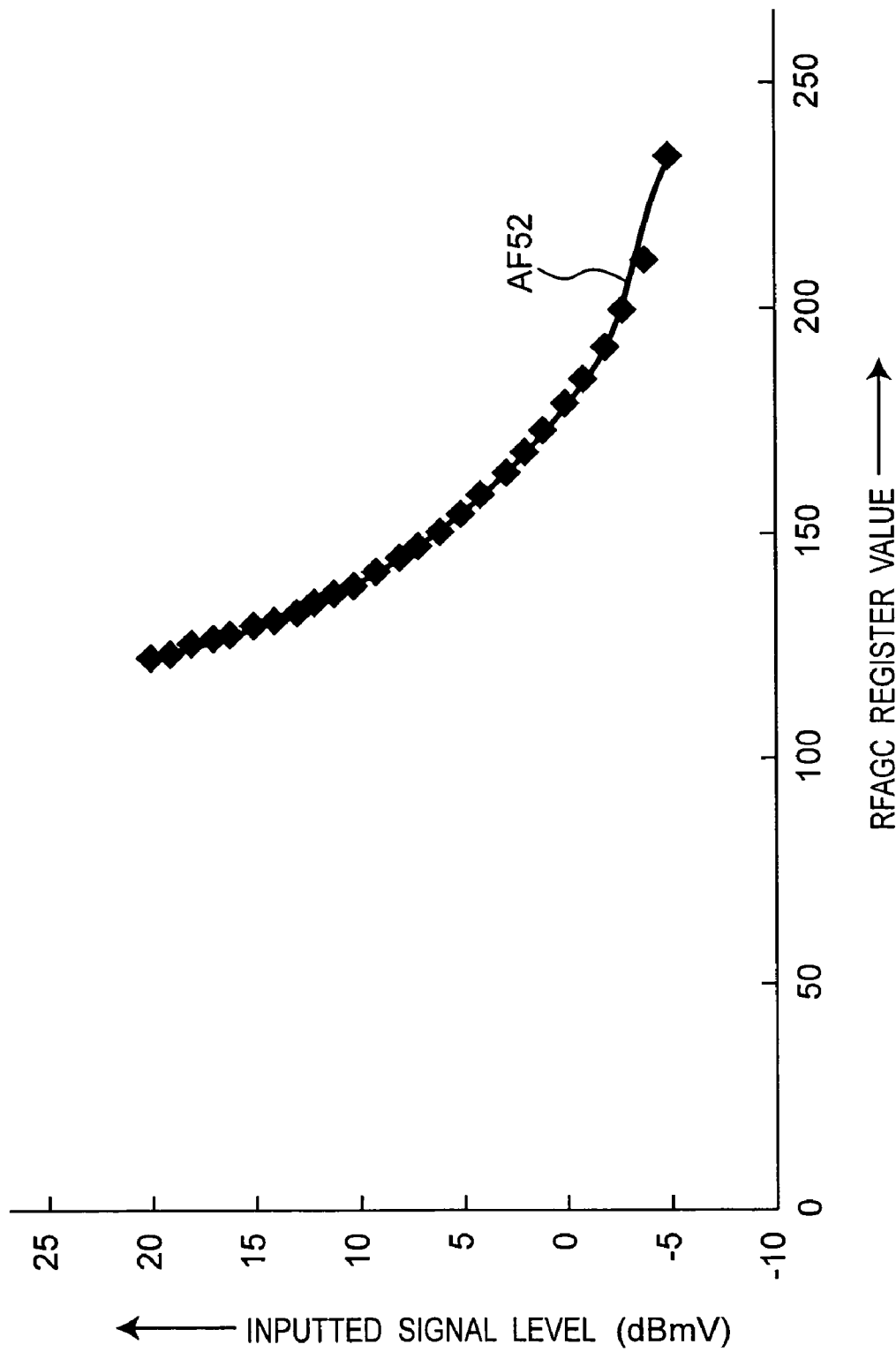
FIG. 18 is a graph showing an approximate function AF52 obtained by approximating measurement results of a relationship of an inputted signal level equal to or larger than a predetermined threshold value to an RFAGC register value by using a predetermined approximate function.
Figure 19:
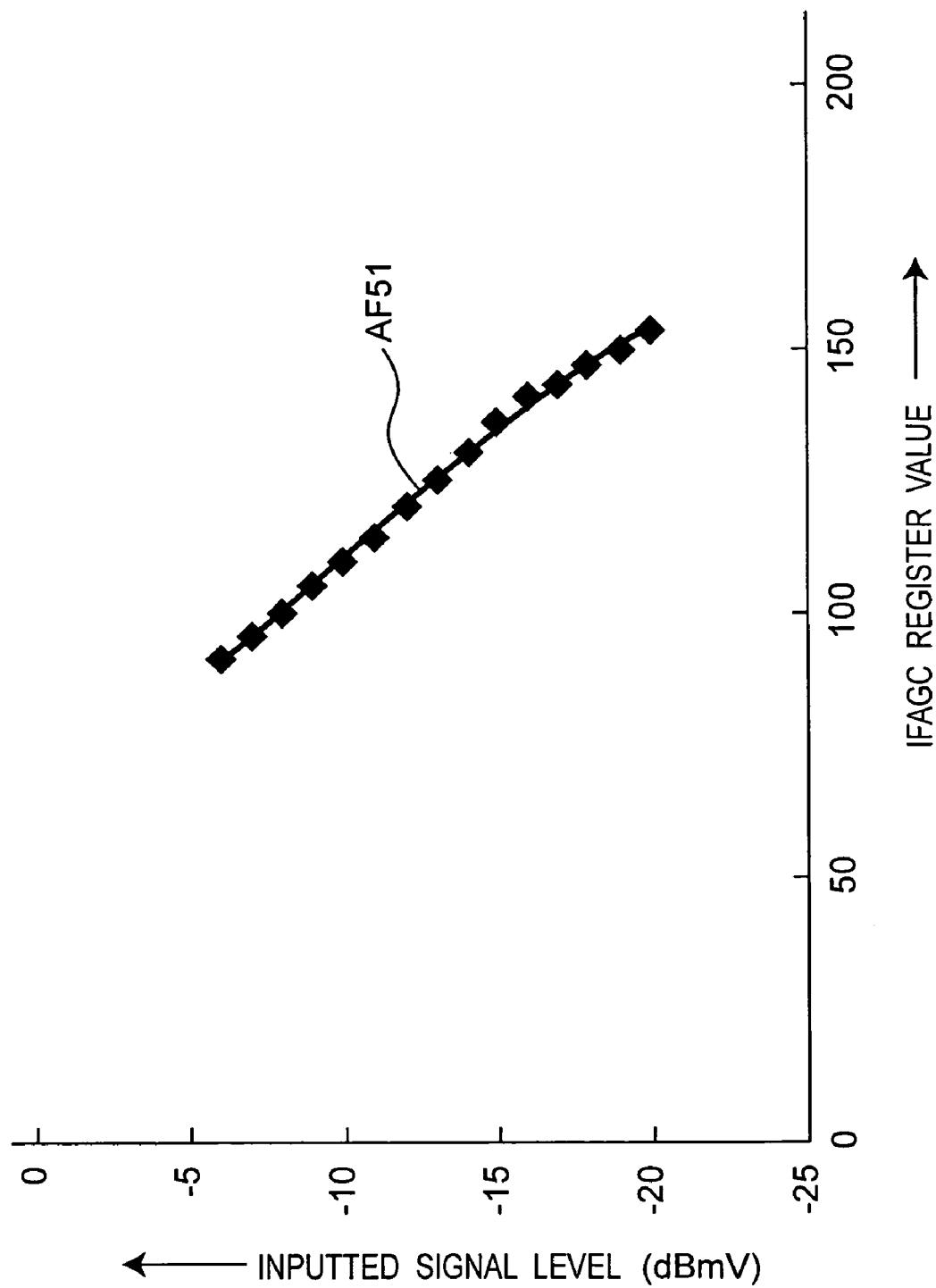
FIG. 19 is a graph showing an approximate function AF51 obtained by approximating measurement results of a relationship of the inputted signal level equal to or smaller than the predetermined threshold value to an IFAGC register value by using a predetermined approximate function.

FIG. 18 is a graph showing an approximate function AF52 obtained by approximating measurement results of the relationship of the inputted signal level equal to or larger than a predetermined threshold value to the RFAGC register value by using a predetermined approximate function. FIG. 19 is a graph showing an approximate function AF51 obtained by approximating measurement results of the relationship of the inputted signal level equal to or smaller than the predetermined threshold value to an IFAGC register value by using a predetermined approximate function. As apparent from FIGS. 18 and 19, the inputted signal level can be detected uniquely from the RFAGC register value and the IFAGC register value on each of the graphs. The reason for this is as follows. When the control flow is not branched based on the condition of the inputted signal level at step S73 shown in FIG. 17, a linear function part (linear part) and a quadric function (curve part) are present as apparent from the graphs shown in FIGS. 7 and 8. In particular, near a part between the linear function and the quadric function, an error may be caused between the approximate function and actual inputted signal level. On the other hand, as described in the present preferred embodiment, the control flow may be branched based on the condition of the inputted signal level at step S73 shown in FIG. 17, and this leads to that these two functions are not present simultaneously on the same graph. Therefore, an approximate function calculation error is small. Accordingly, the accuracy for detecting the inputted signal level can be advantageously and remarkably improved.

Fifth Preferred Embodiment

Figure 20:
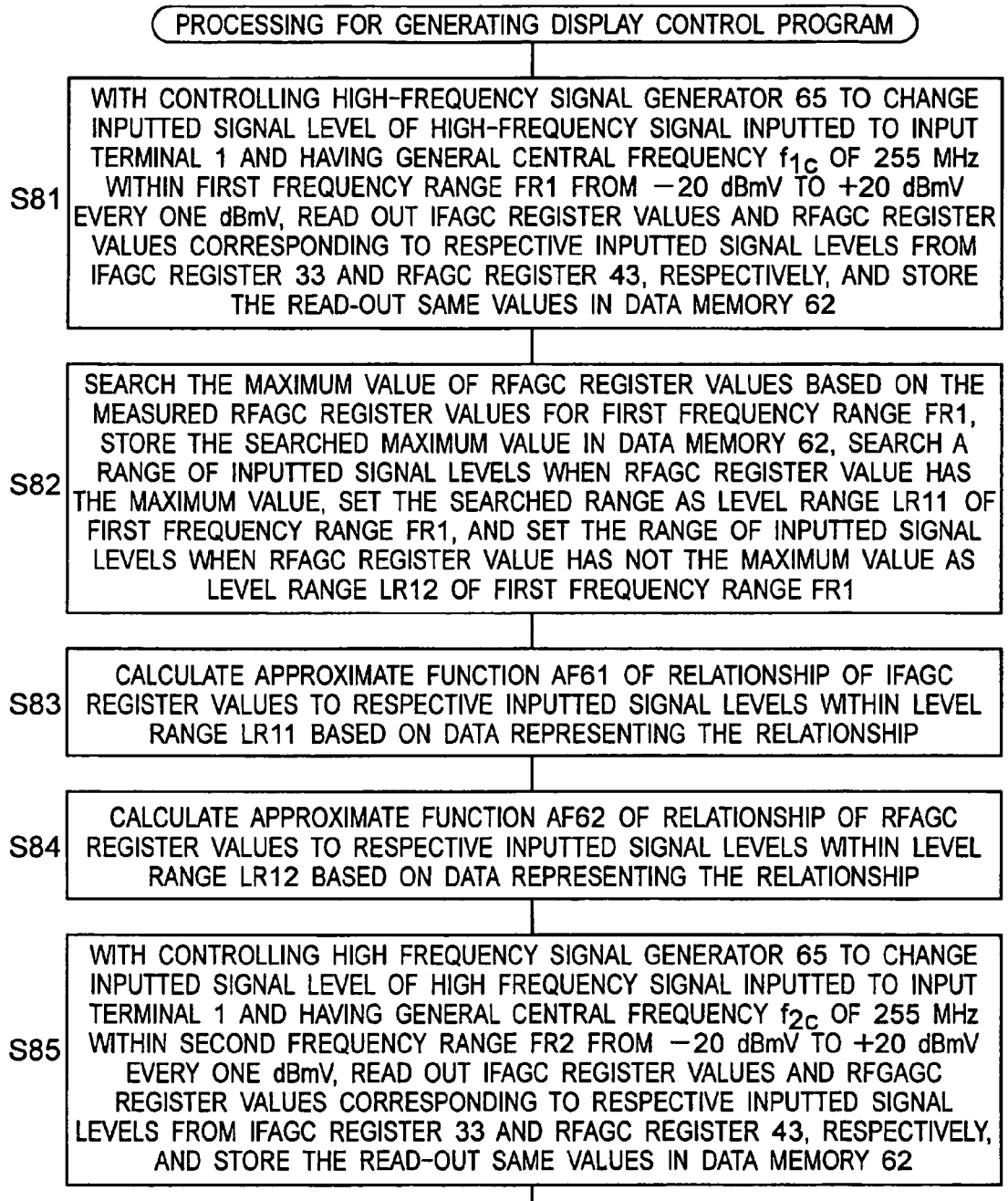
FIG. 20 is a flowchart showing a first part of a processing for generating a display control program, which is executed by a controller 60 of a measurement control system according to a fifth preferred embodiment.
Figure 21:
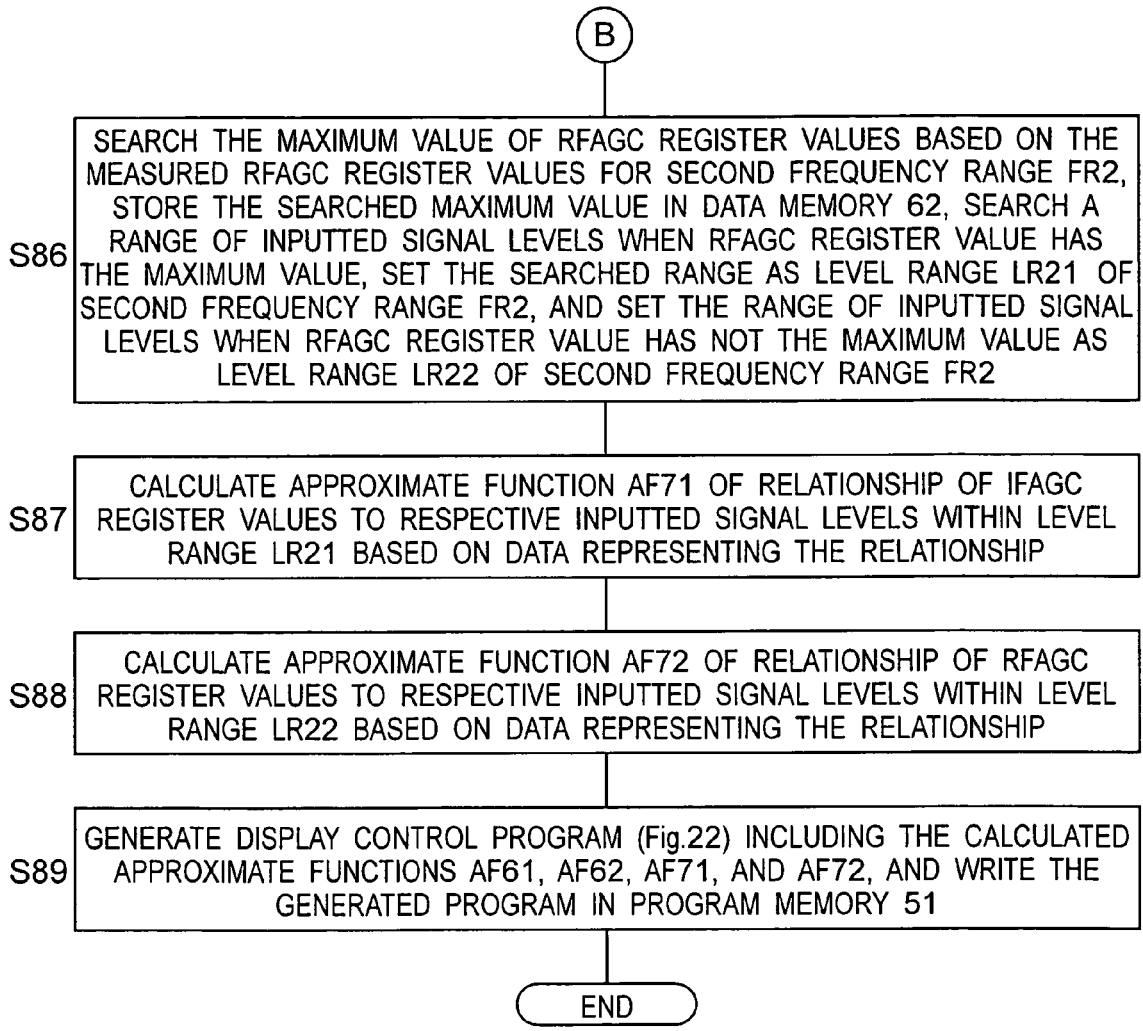
FIG. 21 is a flowchart showing a second part of a processing for generating a display control program, which is executed by a controller 60 of a measurement control system according to a fifth preferred embodiment.
Figure 22:
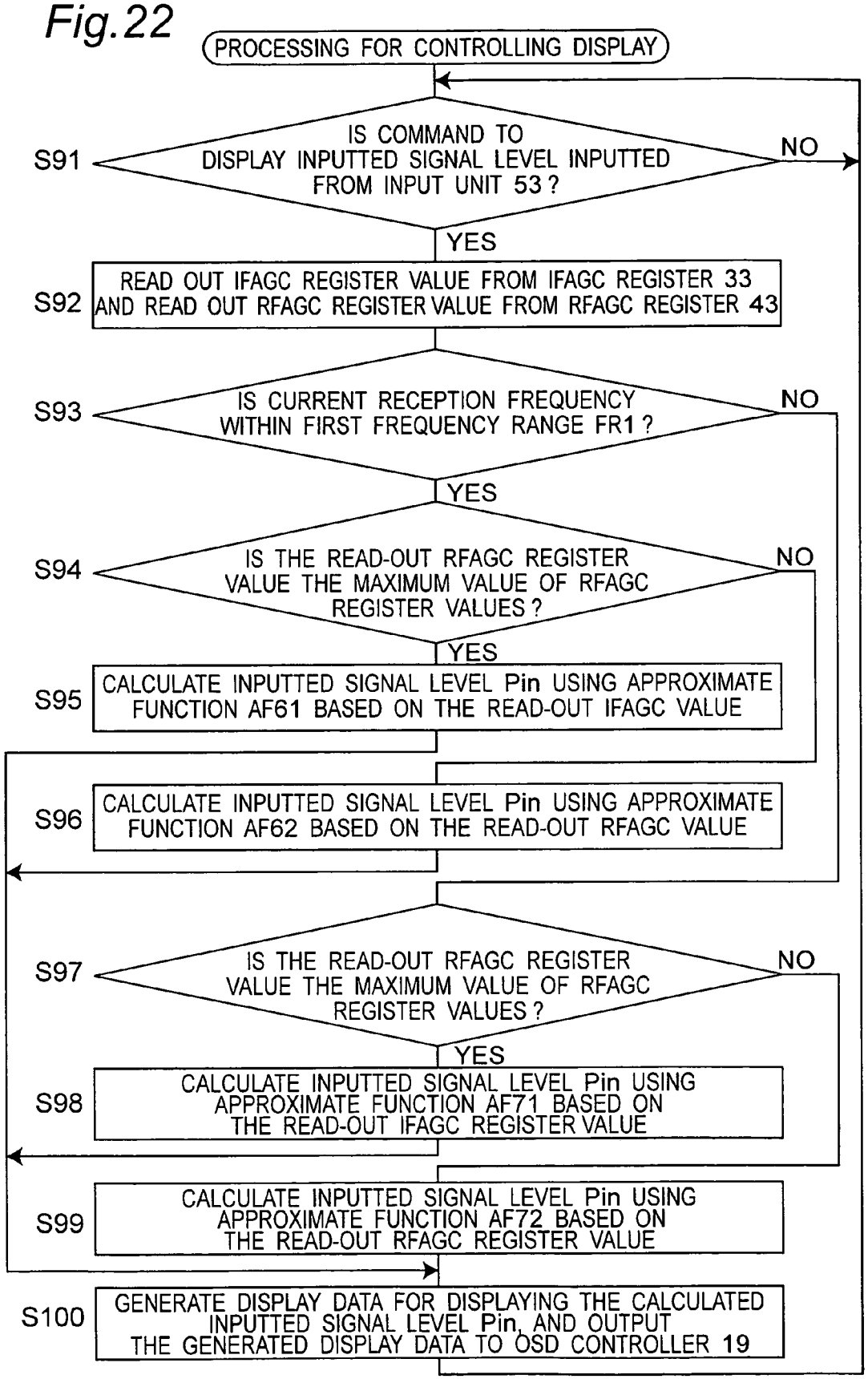
FIG. 22 is a flowchart showing a processing for controlling display, which is executed by a controller 50 according to the fifth preferred embodiment.

FIGS. 20 and 21 are flowcharts showing a processing for generating a display control program, which is executed by a controller 60 of a measurement control system according to a fifth preferred embodiment. FIG. 22 is a flowchart showing a processing for controlling display, which is executed by a controller 50 according to the fifth preferred embodiment.

The fifth preferred embodiment is characterized by the use of the calculation of approximate functions by dividing the frequency range of the broadcasting signal into the two ranges according to the second preferred embodiment in addition to such a use that the control flow is branched based on the condition of the inputted signal level according to the fourth preferred embodiment.

In the processing for generating the display control program shown in FIG. 20, at step S81, with controlling a high-frequency signal generator 65 to change the inputted signal level of a high-frequency signal inputted to an input terminal 1 and having a general central frequency $f_{1c}$ of 255 MHz-within a first frequency range FR1 from −20 dBmV to +20 dBmV every one dBmV, the controller 60 reads out IFAGC register values and RFAGC register values corresponding to the respective inputted signal levels from an IFAGC register 33 and an RFAGC register 43, respectively, and stores the read-out same values in a data memory 62. Next, at step S82, the controller 60 searches the maximum value of the RFAGC register values based on the measured RFAGC register values for the first frequency range FR1, and stores the searched maximum value thereof in the data memory 62. In addition, the controller 60 searches a range of the inputted signal level when the RFAGC register value has the maximum value thereof, and sets the searched range as a level range LR11 of the first frequency range FR1. The controller 60 sets a range of the inputted signal level when the RFAGC register value does not have the maximum value thereof as a level range LR12 of the first frequency range FR1. Then, at step S83, the controller 60 calculates an approximate function AF61 of a relationship of the IFAGC register values to the respective inputted signal levels within the level range LR11 based on the data representing this relationship. At step S84, the controller 60 calculates an approximate function AF62 of a relationship of the RFAGC register values to the respective inputted signal levels within the level range LR12 based on the data representing this relationship. Further, at step S85, with controlling the high-frequency signal generator 65 to change the inputted signal level of the high-frequency signal inputted to the input terminal 1 and having a general central frequency $f_{2c}$ of 255 MHz within a second frequency range FR2 from −20 dBmV to +20 dBmV every one dBmV, the controller 60 reads out IFAGC register values and RFAGC register values corresponding to the respective inputted signal levels from the IFAGC register 33 and the RFAGC register 43, respectively, and stores the read-out same values in the data memory 62. Thereafter, the processing flow goes to step S86 shown in FIG. 21.

At step S86 shown in FIG. 21, the controller 60 searches the maximum value of the RFAGC register values based on the measured RFAGC register values for the second frequency range FR2, and stores the searched maximum value thereof in the data memory 62. In addition, the controller 60 searches a range of the inputted signal levels when the RFAGC register value has the maximum value thereof, and sets the searched range as a level range LR21 of the second frequency range FR2. The controller 60 sets the range of the inputted signal levels when the RFAGC register value does not have the maximum value thereof as a level range LR22 of the second frequency range FR2. Next, at step S87, the controller 60 calculates an approximate function AF71 of a relationship of the IFAGC register values to the respective inputted signal levels within the level range LR21 based on the data representing this relationship. At step S88, the controller 60 calculates an approximate function AF72 of a relationship of the RFAGC register values to the respective inputted signal levels within the level range LR22 based on the data representing this relationship. Further, at step S89, the controller 60 generates a display control program (FIG. 22) including the calculated approximate functions AF61, AF62, AF71 and AF72, and writes the generated display control program in a program memory 51 of the controller 50, thus finishing the processing for generating the display control program.

In the processing for controlling display shown in FIG. 22, at step S91, the controller 50 judges whether or not a command to display the inputted signal level is inputted from an input unit 53. If YES at step S91, the processing flow goes to step S92. On the other hand, if NO at step S91, the processing flow returns to step S91. Next, at step S92, the controller 50 reads out the IFAGC register value from an IFAGC register 33 and reads out the RFAGC register value from an RFAGC register value 43. At step S93, the controller 50 judges whether or not a current reception frequency is fallen within the first frequency range FR1. If YES at step S93, the processing flow goes to step S94. On the other hand, if NO at step S93, the processing flow goes to step S97. Then, at step S94, the controller 50 judges whether or not the read-out RFAGC register value is the maximum value of the RFAGC register values. If YES at step S94, the processing flow goes to step S95. On the other hand, if NO at step S94, the processing flow goes to step S96. At step S95, the controller 50 calculates an inputted signal level Pin using the approximate function AF61 based on the read-out IFAGC register value, and the processing flow goes to step S100. On the other hand, at step S96, the controller 50 calculates the inputted signal level Pin using the approximate function AF62 based on the read-out RFAGC register value, and the processing flow goes to step S100.

Next, at step-S97, the controller 50 judges whether or not the read-out RFAGC register value is the maximum value of the RFAGC register values. If YES at step S97, the processing flow goes to step S98. On the other hand, if NO at step S97, the processing flow goes to step S99. At step S98, the controller 50 calculates the inputted signal level Pin using the approximate function AF71 based on the read-out IFAGC register value, and the processing flow goes to step S100. On the other hand, at step S99, the controller 50 calculates the inputted signal level Pin using the approximate function AF72 based on the read-out RFAGC register value, and the processing flow goes to step S100. Further, at step S100, the controller 50 generates display data for displaying the calculated inputted signal level Pin, and outputs the generated display data to an OSD controller 19. The processing flow then returns to step S91.

As stated above, according to the fifth preferred embodiment, by using the calculation of the approximate functions by dividing the frequency range of the broadcasting signal into the two ranges according to the second preferred embodiment in addition to such a use that the control flow is branched based on the condition of the inputted signal level according to the fourth preferred embodiment, accuracy for detecting the inputted signal level of the high-frequency signal can be more remarkably improved.

Sixth Preferred Embodiment

Figure 24:
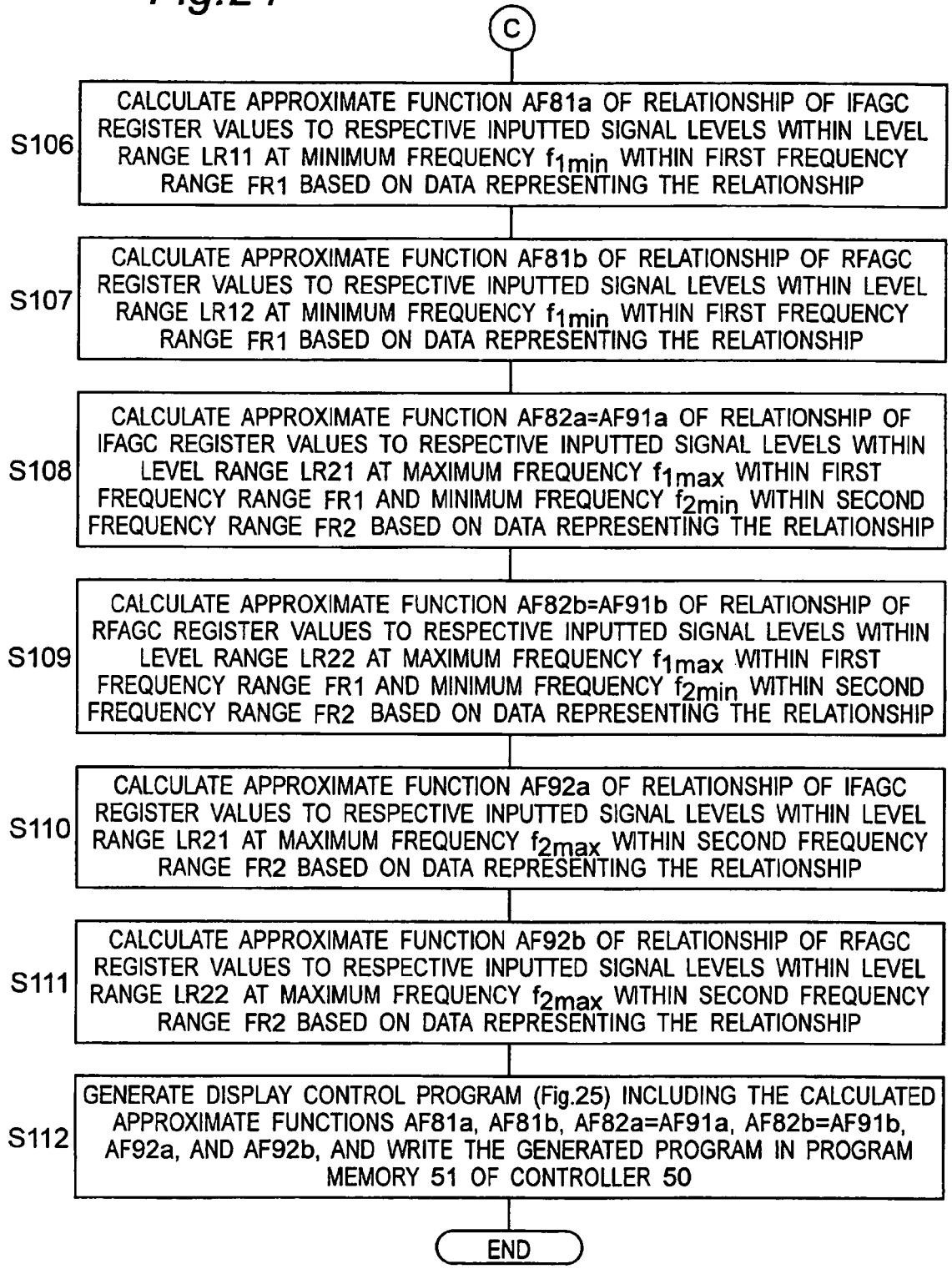
FIG. 24 is a flowchart showing a second part of a processing for generating a display control program, which is executed by a controller 60 of a measurement control system according to a sixth preferred embodiment.
Figure 25:
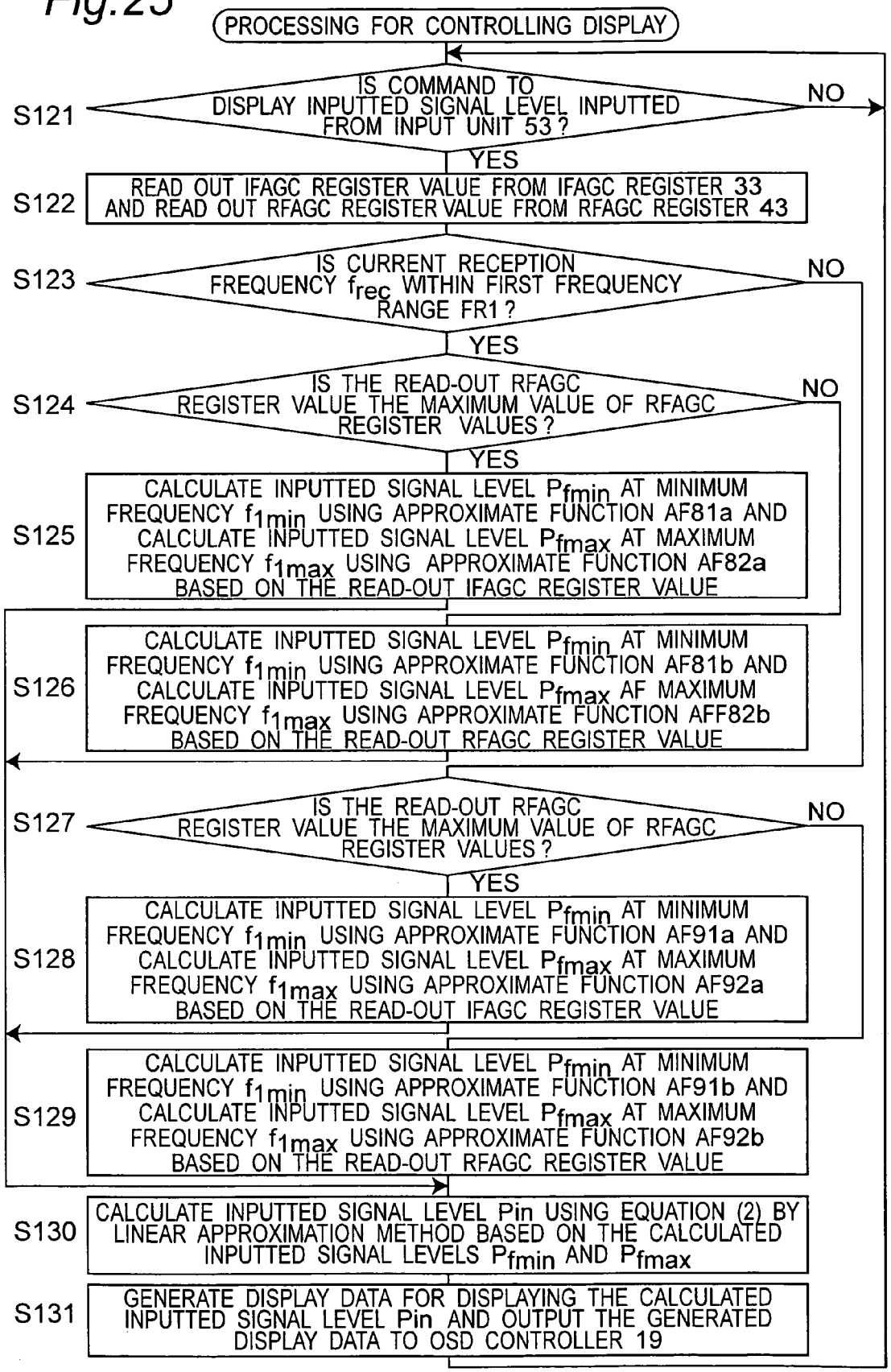
FIG. 25 is a flowchart showing a processing for controlling display, which is executed by a controller 50 according to the sixth preferred embodiment.

FIGS. 23 and 24 are flowcharts showing a processing for generating a display control program, which is executed by a controller 60 of a measurement control system according to a sixth preferred embodiment. FIG. 25 is a flowchart showing a processing for controlling display, which is executed by a controller 50 according to the sixth preferred embodiment.

The sixth preferred embodiment is characterized by detecting an inputted signal level based on such a condition as to whether or not the RFAGC register value is the maximum value thereof according to the fourth preferred embodiment in addition to such a use that the control flow is branched based on the condition of the inputted signal level according to the fourth preferred embodiment as well as the use of the calculation of approximate functions by dividing the frequency range of the broadcasting signal into the two ranges according to the second preferred embodiment.

In the processing for generating the display control program shown in FIG. 23, at step S101, with controlling a high-frequency signal generator 65 to change the inputted signal level of the high-frequency signal inputted to an input terminal 1 and having a minimum frequency $f_{1min}$ of 57 MHz within a first, frequency range FR1 from −20 dBmV to +20 dBmV every one dBmV, the controller 60 reads out. IFAGC register values and RFAGC register values corresponding to the respective inputted signal levels from an IFAGC register 33 and an RFAGC register 43, respectively, and stores the read-out same values in a data memory 62. Next, at step S102, with controlling the high-frequency signal generator 65 to change the inputted signal level of the high-frequency signal inputted to the input terminal 1 and having a maximum frequency $f_{1max}$ of 459 MHz within the first frequency range FR1 and a minimum frequency $f_{2min}$ of 459 MHz within a second frequency range FR2 from −20 dBmV to +20 dBmV every one dBmV, the controller 60 reads out IFAGC register values and RFAGC register values corresponding to the respective inputted signal levels from the IFAGC register 33 and the RFAGC register 43, respectively, and stores the read-out same values in the data memory 62. Further, at step S103, with controlling the high-frequency signal generator 65 to change the inputted signal level of the high-frequency signal inputted to the input terminal 1 and having a maximum frequency $f_{2max}$ of 861 MHz within the second frequency range FR2 from −20 dBmV to +20 dBmV every one dBmV, the controller 60 reads out IFAGC register values and RFAGC register values corresponding to the respective inputted signal levels from the IFAGC register 33 and the RFAGC register 43, respectively, and stores the read-out same values in the data memory 62.

At step S104, the controller 60 searches the maximum value of the RFAGC register values based on the measured RFAGC register values at the minimum frequency $f_{1min}$ of the first frequency range FR1, and stores the searched maximum value thereof in the data memory 62 as the maximum value of the RFAGC register values within the first frequency range FR1. In addition, the controller 60 searches a range of the inputted signal levels when the RFAGC register value has the maximum value thereof, and sets the searched range as a level range LR11 of the first frequency range FR1. The controller 60 sets the range of the inputted signal level when the RFAGC register value does not have the maximum value thereof as a level range LR12 of the first frequency range FR1. Next, at step S105, the controller 60 searches the maximum value of the RFAGC register values based on the measured RFAGC register values at the minimum frequency $f_{2min}$ in the second frequency range FR2, and stores the searched maximum values thereof within the data memory 62 as the maximum value of the RFAGC register values in the second frequency range FR2. In addition, the controller 60 searches a range of the inputted signal levels when the RFAGC register value has the maximum value thereof, and sets the searched range as a level range LR21 of the second frequency range FR2. The controller 60 sets the range of the inputted signal levels when the RFAGC register value does not have the maximum value thereof as a level range LR22 of the second frequency range FR2.

At step S106 shown in FIG. 24, the controller 60 calculates an approximate function AF81$a$ of a relationship of the IFAGC register values to the respective inputted signal levels within the level range LR11 at the minimum frequency $f_{1min}$ within the first frequency range FR1 based on the data representing this relationship. At step S107, the controller 60 calculates an approximate function AF81$b$ of a relationship of the RFAGC register values to the respective inputted signal levels within the level range LR12 at the minimum frequency $f_{1min}$ within the first frequency range FR1 based on the data representing this relationship. Next, at step S108, the controller 60 calculates an approximate function AF82$a$=AF91$a$ of a relationship of the IFAGC register values to the respective inputted signal levels within the level range LR21 at the maximum frequency $f_{1max}$ within the first frequency range FR1 and at the minimum frequency $f_{2min}$ in the second frequency range FR2 based on the data representing this relationship. At step S109, the controller 60 calculates an approximate function AF82$b$=AF91$b$ of a relationship of the RFAGC register values to the respective inputted signal levels within the level range LR22 at the maximum frequency $f_{1max}$ within the first frequency range FR1 and at the minimum frequency $f_{2min}$ within the second frequency range FR2 based on the data representing this relationship. Further, at step S110, the controller 60 calculates an approximate function AF92$a$ of a relationship of the IFAGC register values to the respective inputted signal levels within the level range LR21 at the maximum frequency $f_{2max}$ within the second frequency range FR2 based on the data representing this relationship. At step S111, the controller 60 calculates an approximate function AF92$b$ of a relationship of the RFAGC register values to the respective inputted signal levels within the level range LR22 at the maximum frequency $f_{2max}$ within the second frequency range FR2 based on the data representing this relationship. Furthermore, at step S112, the controller 60 generates a display control program (FIG. 25) including the calculated approximate functions AF81$a$, AF81$b$, AF82$a$=AF91$a$, AF82$b$=AF91$b$, AF92$a$, and AF92$b$, and writes the generated display control program in a program memory 51 of the controller 50, thus finishing the processing for generating the display control program.

In the processing for controlling display shown in FIG. 25, at step S121, the controller 50 judges whether or not a command to display the inputted signal level is inputted from an input unit 53. If YES at step S121, the processing flow goes to step S122. On the other hand, if NO at step S121, the processing flow returns to step S121. At step S122, the controller 50 reads out the IFAGC register value from an IFAGC register 33 and reads out the RFAGC register value from an RFAGC register value 43. At step S123, the controller 50 judges whether or not a current reception frequency $f_{rec}$ is fallen within the first frequency range FR1. If YES at step S123, the processing flow goes to step S124. On the other hand, if NO at step S123, the processing flow goes to step S127.

Next, at step S124, the controller 50 judges whether or not the read-out RFAGC register value is the maximum value of the RFAGC register values. If YES at step S124, the processing flow goes to step S125. On the other hand, if NO at step S124, the processing flow goes to step S126. At step S125, the controller 50 calculates an inputted signal level $P_{fmin}$ at the minimum frequency $f_{1min}$ using the approximate function AF81$a$ and an inputted signal level $P_{fmax}$ at the maximum frequency $f_{1max}$ using the approximate function AF82$a$ based on the read-out IFAGC register value, and the processing flow goes to step S130. On the other hand, at step S126, the controller 50 calculates an inputted signal level $P_{fmin}$ at the minimum frequency $f_{1min}$ using the approximate function AF81$b$ and an inputted signal level $P_{fmax}$ at the maximum frequency $f_{1max}$ using the approximate function AF82b based on the read-out RFAGC register value, and the processing flow goes to step S130.

Next, at step S127, the controller 50 judges whether or not the read-out RFAGC register value is the maximum value of the RFAGC register values. If YES at step S127, the processing flow goes to step S128. On the other hand, if NO at step S127, the processing flow goes to step S129. At step S128, the controller 50 calculates the inputted signal level $P_{fmin}$ at the minimum frequency $f_{1min}$ using the approximate function AF91a and the inputted signal level $P_{fmax}$ at the maximum frequency $f_{1max}$ using the approximate function AF92a based on the read-out IFAGC register value, and the processing flow goes to step S130. On the other hand, at step S129, the controller 50 calculates the inputted signal level $P_{fmin}$ at the minimum frequency $f_{1min}$ using the approximate function AF91b and the inputted signal level $P_{fmax}$ at the maximum frequency $f_{1max}$ using the approximate function AF92b based on the read-out RFAGC register value, and the processing flow goes to step S130.

Further, at step S130, the controller 50 calculates an inputted signal level Pin using the equation (2) by the linear approximation method based on the calculated inputted signal levels $P_{fmin}$ and $P_{fmax}$. At step S131, the controller 50 generates display data for displaying the calculated inputted signal level Pin, and outputs the generated display data to an OSD controller 19, thus finishing the processing for controlling display.

As stated above, according to the sixth preferred embodiment, the inputted signal level is detected based on condition as to whether or not the RFAGC register value is the maximum value thereof according to the fourth preferred embodiment in addition to such a use that the control flow is branched based on the inputted signal level according to the condition according to the fourth preferred embodiment as well as the use of the calculation of approximate functions by dividing the frequency range of the broadcasting signal into the two ranges according to the second preferred embodiment. Therefore, the accuracy for detecting the inputted signal level of the high-frequency signal can be further improved.

Seventh Preferred Embodiment

Figure 26:
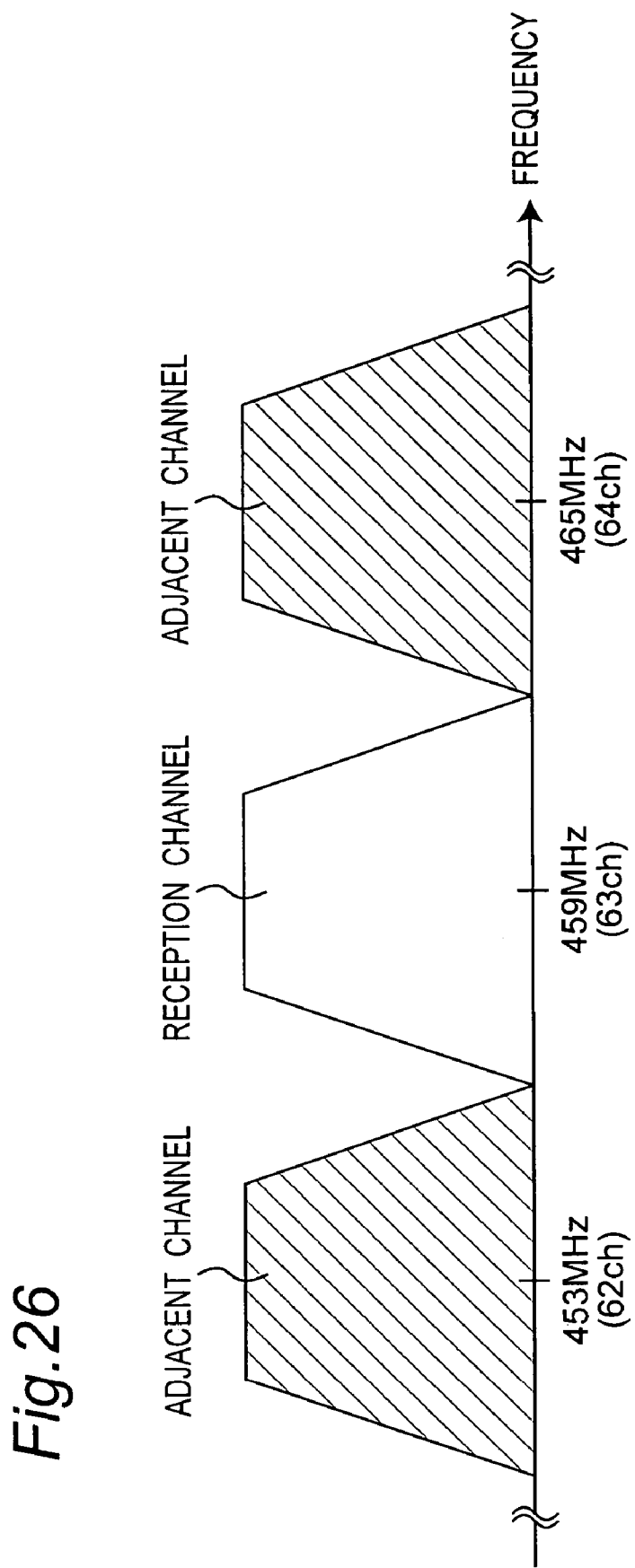
FIG. 26 is a spectral view showing such a case that two interference signals on adjacent channels are present on both sides of a reception channel for a television receiver 100 according to a seventh preferred-embodiment.

FIG. 26 is a spectral view showing such a case that two interference signals on adjacent channels are present in the vicinity and on both sides of a reception channel for a television receiver 100 according to a seventh preferred embodiment. As shown in FIG. 26, when a spectral energy of a broadcasting signal on the adjacent channel is present on each or one side of the reception channel on which an inputted signal level is detected, there is caused such a problem that one or two interference signals due to a broadcasting signal on each adjacent channel causes a detected error in detection of the inputted signal level of the broadcasting signal. The reason for this is as follows. An intermediate frequency signal processing circuit such as the bandpass filter 8 shown in FIG. 1 does not exhibit a sharp bandpass filtering characteristic that the circuit can completely remove the interference signal on the adjacent channel.

Figure 27:
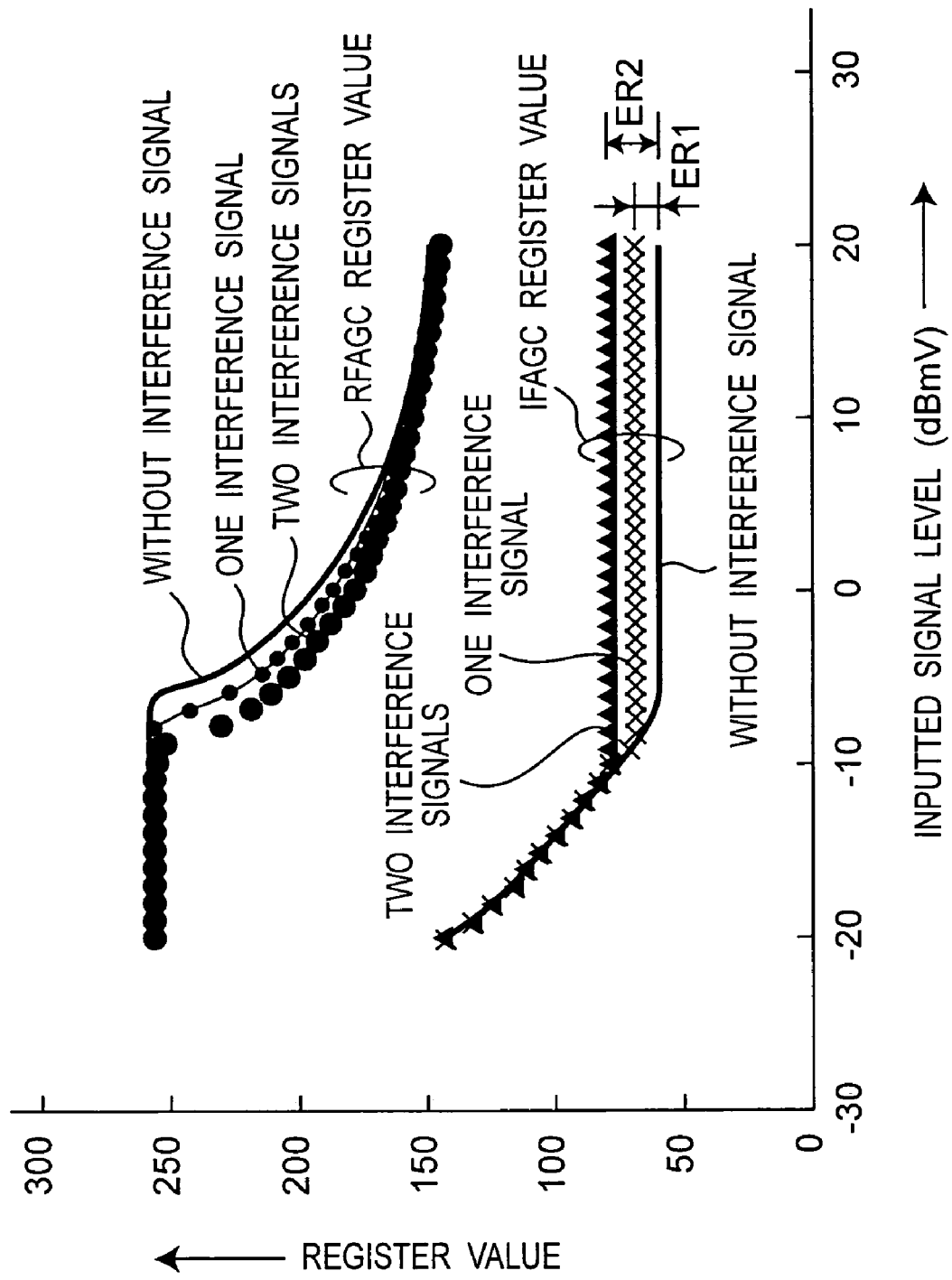
FIG. 27 is a graph showing IFAGC register values and RFAGC register values relative to inputted signal levels in three cases when the interference signal on adjacent channel is not present, when one interference signal is present, and when two interference signals are present, respectively, in the television receiver 100 according to the seventh preferred embodiment.

FIG. 27 is a graph showing IFAGC register values and RFAGC register values relative to inputted signal levels in three cases when the interference signal on adjacent channel is not present, when one interference signal is present, and when two interference signals are present, respectively, in the television receiver 100 according to the seventh preferred embodiment. As apparent from FIG. 27, display errors may be caused to the RFAGC register values and the IFAGC register values relative to the respective inputted signal levels. Concretely, as for the IFAGC register value, a detected error ER1 is caused when one interference signal is present as compared with such a case that no interference signal is present, and a detected error ER2 (>ER1) is caused when two interference signals are present as compared with such a case that no interference signal is present. It is also seen from FIG. 27 that the detected error due to the interference signal is greater when the inputted signal level is almost equal to or larger than about −10 dBmV (in other words, when the RFAGC register value is not the maximum value thereof).

In other words, FIG. 27 exemplarily shows the above-stated three cases. For an actually distributed broadcasting signal, various kinds of patterns of a relationship of a DU ratio of a broadcasting signal on a reception channel to a broadcasting signal on an adjacent channel are present. Therefore, according to the present preferred embodiment, such a case that the reception channel is located at an intermediate position in a channel allocation and that adjacent channels (two interference signals) are present on both sides of the reception channel, respectively, and such a case that the reception channel is located at an end in the channel allocation and that an adjacent channel (one interference signal) is present only on one side of the reception channel are considered. An approximate function AF102 of the detected error ER2 in the former case and an approximate function AF101 for the detected error ER1 in the latter case are measured in advance. In addition, when the RFAGC register value is not the maximum value thereof, a detection level of the inputted signal level of the received broadcasting signal is corrected using the detected error ER1 or ER2 calculated using the approximate function AF101 or AF102 based on the IFAGC register value, whose change amount is larger than that of the RFAGC register value.

Figure 28:
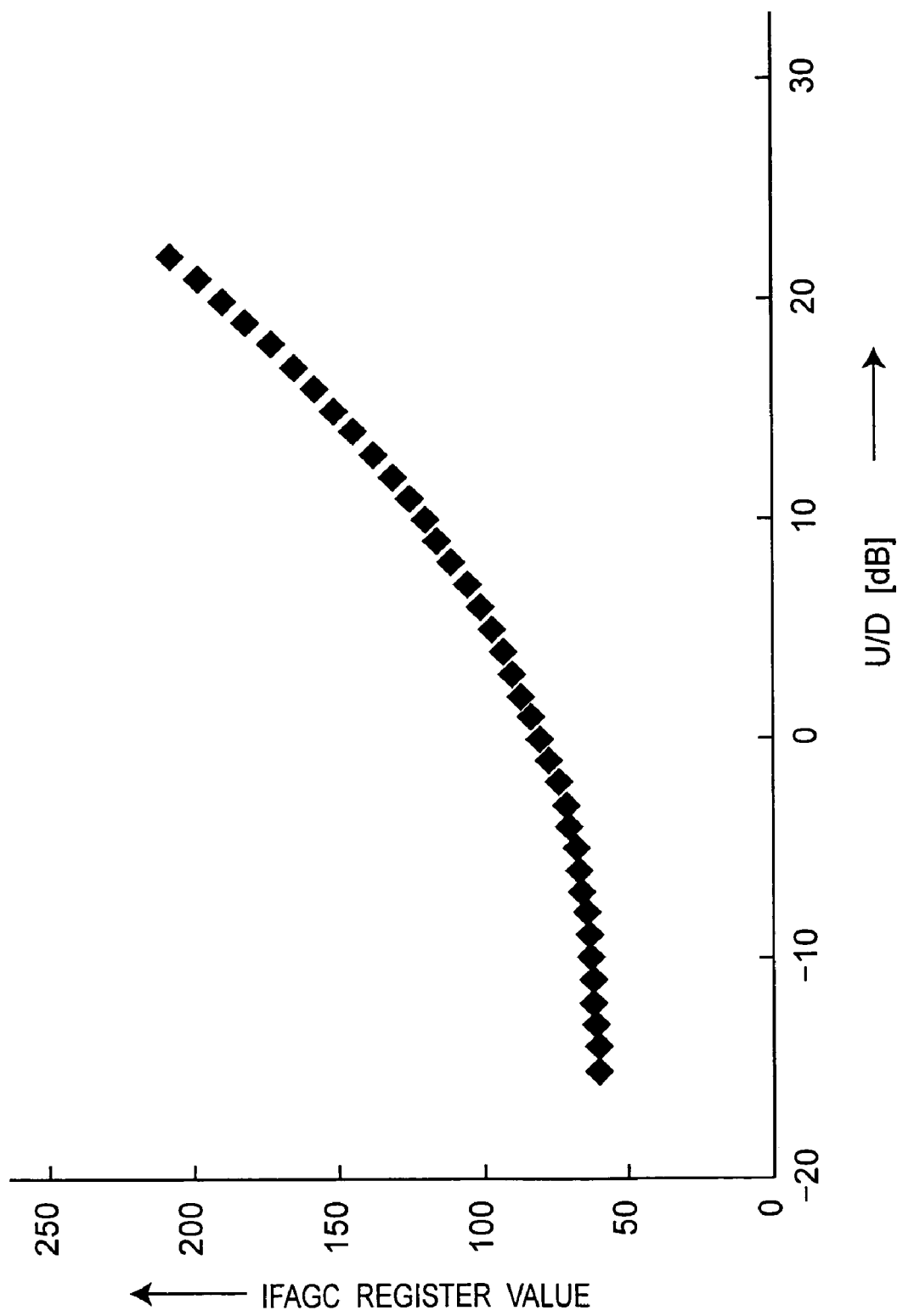
FIG. 28 is a graph showing the IFAGC register value relative to a ratio (U/D) of an interference signal power to a desired wave power in the television receiver 100 according to the seventh preferred embodiment.

FIG. 28 is a graph showing the IFAGC register value relative to a ratio (U/D) of an interference signal power to a desired wave power in the television receiver 100 according to the seventh preferred embodiment. As apparent from FIG. 28, as the ratio (U/D) of the interference signal power to the desired wave power becomes greater, the IFAGC register value also increases.

Figure 29:
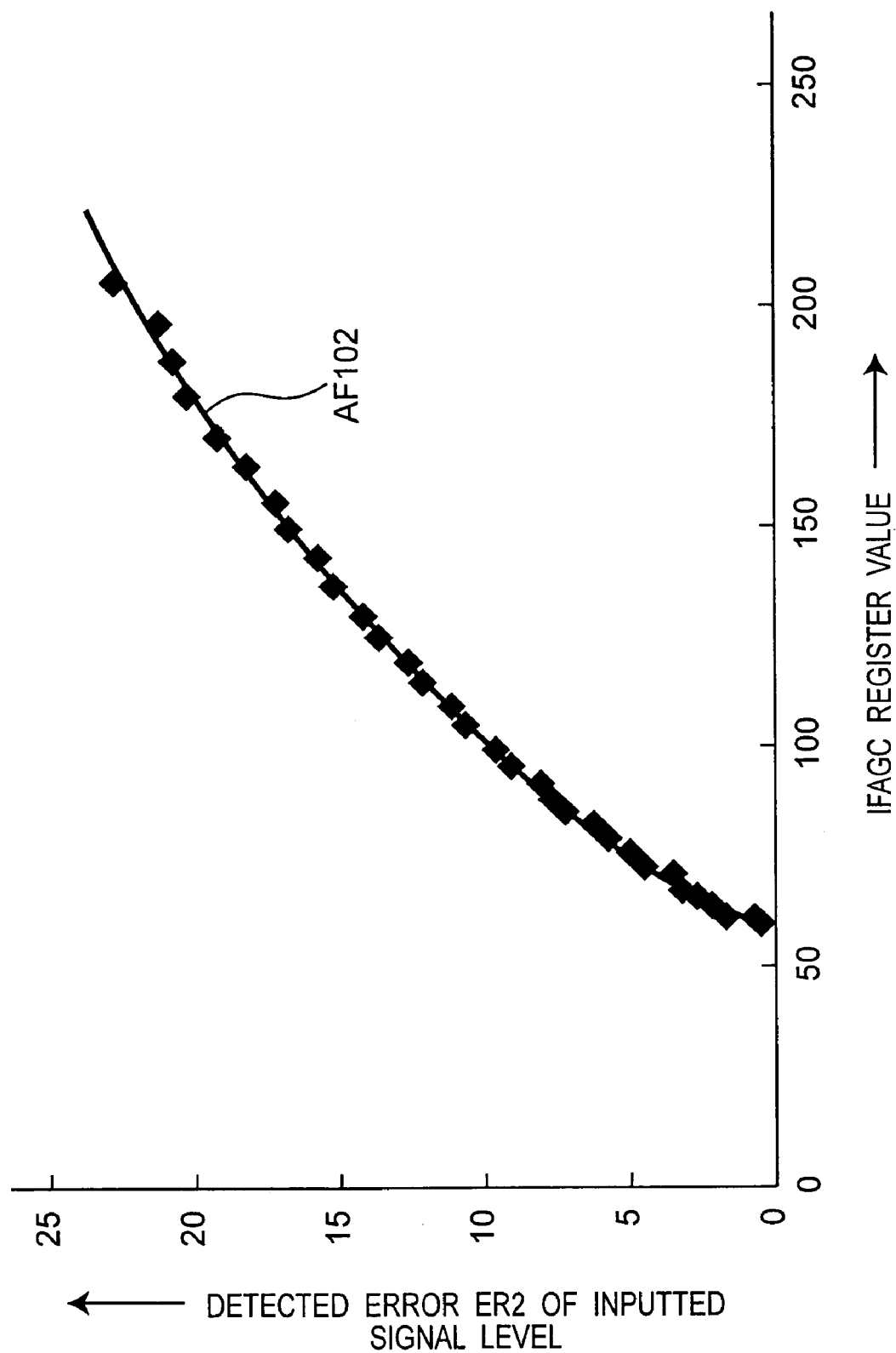
FIG. 29 is a graph showing a display error ER2 of the inputted signal level relative to the IFAGC register value in the television receiver 100 according to the seventh preferred embodiment.

FIG. 29 is a graph showing a display error ER2 of the inputted signal level relative to the IFAGC register value in the television receiver 100 according to the seventh preferred embodiment. In the example of FIG. 29, the approximate function AF102 when two interference signals are present is shown. Likewise, the approximate function AF101 when one interference signal is present is calculated in advance. The present preferred embodiment is characterized as follows. By executing a processing for correcting the detected error shown in FIG. 30 using these two approximate functions AF101 and AF102, the detected error in the inputted signal level can be corrected based on the IFAGC register value, in particular when the IFAGC register value is not the maximum value thereof and the detected error is relatively large.

FIG. 30 is a flowchart that showing a characteristic part of a processing for controlling display, which is executed by a controller 50 according to the seventh preferred embodiment. The characteristic part of this processing relates to the processing for correcting the detected error, and is inserted between steps S130 and S131 shown in FIG. 25.

After the processing at step S130 shown in FIG. 25, the processing flow goes to step S141 shown in FIG. 30. At step S141, the controller 50 judges whether or not the read-out RFAGC register value is the maximum value of the RFAGC values. If YES at step S141, the processing flow goes to step S131 shown in FIG. 25. On the other hand, if NO at step S141, the processing flow goes to step S142. At step S142, the controller 50 judges whether or not adjacent channels are present on the both sides of the reception channel. If YES at step S142, the controller 50 judges that two interference signals are present and the processing flow goes to step S143. On the other hand, if NO at step S142, the controller 50 judges that one interference signal is present and the processing flow goes to step S145. At step S143, the controller 50 calculates the detected error ER2 using the approximate function AF102 of the detected error of the inputted signal level based on the read-out IFAGC register value. At step S144, the controller 50 sets the detected error ER2 as a detected error ER, and the processing flow goes to step S147. On the other hand, at step S145, the controller 50 calculates the detected error ER1 using the approximate function AF101 of the detected error in the inputted signal level based on the read-out IFAGC register value. At step S144, the controller 50 sets the detected error ER1 as the detected error ER, and the processing flow goes to step S147. Further, at step S147, the controller 50 adds the detected error ER to the previously calculated inputted signal level Pin, and sets an addition result as the inputted signal level Pin. Thereafter, the processing flow goes to step S131 shown in FIG. 25.

As stated above, according to the seventh preferred embodiment, the processing for correcting the detected error shown in FIG. 30 is executed using the two approximate functions AF101 and AF102 calculated in advance, and this leads to that the detected error in the inputted signal level is corrected based on the IFAGC register value, in particular when the IFAGC register is not the maximum value thereof and the detected error is relatively large. Then it is possible to remarkably improve the detected error in the inputted signal level of the broadcasting signal.

In the seventh preferred embodiment stated above, the control flow is branched into such a case of one interference signal and such another case of two interference signals at step S142. However, the latter case applies to most cases. Therefore, only the processing in the latter case may be executed. Further, an average value of the detected errors in these two cases may be used as the detected error and the inputted signal level may be corrected using this detected error.

The processing for correcting the detected error according to the seventh preferred embodiment stated above is inserted between steps S130 and S131 shown in FIG. 25. However, the present invention is not limited to this. The processing for correcting the detected error according to the present preferred embodiment may be executed for the detected value of the inputted signal level Pin in any of the first to fifth preferred embodiments stated above.

MODIFICATION EXAMPLES

In the preferred embodiments stated so far, the attenuation amount of the attenuator 4 is changed so as to control the gain for the high-frequency signal in the television receiver 100 shown in FIG. 1. However, the preset invention is not limited to this. The amplification factor of the high-frequency amplifier 3 may be changed.

In the preferred embodiments stated so far, the amplification factor of the intermediate frequency amplifier 7 is changed so as to control the gain for the intermediate frequency signal in the television receiver 100 shown in FIG. 1. However, the present invention is not limited to this. The amplification ratio of the other intermediate frequency amplifier 9 or the attenuation amount of the attenuator inserted while the frequency is the intermediate frequency may be changed.

In the preferred embodiments stated so far, the television receiver 100 shown in FIG. 1 has been described. However, the present invention is not limited to this. A part of a set-top box that includes a function of detecting the inputted signal level may be separately provided. Further, a high-frequency signal level detection apparatus or a high-frequency signal receiver apparatus that include a function of detecting an inputted signal level of a high-frequency signal other than the broadcasting signal may be provided.

In the preferred embodiments stated so far, the processings performed by the characteristic parts according to the respective preferred embodiments and combinations thereof have been described. However, the present invention is not limited to this and processings in combinations other than the above-stated combinations may be executed.

INDUSTRIAL APPLICABILITY

As stated so far, according to the present invention, the first relational data indicating the RFAGC value relative to the inputted signal level of the received high-frequency signal and the second relational data indicating the IFAGC value relative to the inputted signal level of the received high-frequency signal are measured in advance. The RFAGC value and the IFAGC value when the high-frequency signal to be measured is received are measured. Based on the measured RFAGC value and IFAGC value, the inputted signal level of the received high-frequency signal is detected using the measured first and second relational data. Therefore, it is possible to provide the high-frequency signal level detection apparatus capable of detecting the signal level of the high-frequency signal with accuracy higher than that of the prior art, and the high-frequency signal receiver apparatus using the same. In this case, the high-frequency signal level detection apparatus according to the present invention can be applied to, for example, a high-frequency signal receiver apparatus such as a set-top box or a television receiver that receives a radio broadcasting signal in addition to a CATV set-top box or a CATV television receiver.

The invention claimed is:

1. A high-frequency signal level determining apparatus comprising:
   an AGC circuit for executing an automatic gain control on an intermediate frequency signal obtained by converting a frequency of a received high-frequency signal, using an RFAGC value for controlling a gain of the received high-frequency signal and an IFAGC value for controlling a gain of the intermediate frequency signal based on the intermediate frequency signal so that an output level of the intermediate frequency signal is substantially constant; and
   determining means for previously measuring first relational data indicating an RFAGC value relative to an inputted signal level of a generated high-frequency signal and second relational data indicating an IFAGC value relative to the inputted signal level of the generated high-frequency signal, for measuring the RFAGC value and the IFAGC value when a high-frequency signal to be measured is received, and for determining the inputted signal level of the received high-frequency signal using the measured first and second relational data based on the measured RFAGC value and IFAGC value,
   wherein the received high-frequency signal has a plurality of frequencies, and wherein said determining means previously measures a first relational data indicating the RFAGC value relative to the inputted signal level and a second relational data indicating the IFAGC value relative to the inputted signal level, using a generated high-frequency signal having a substantial central frequency among the plurality of frequencies.

2. The high-frequency signal level determining apparatus as claimed in claim 1,
wherein said determining means determines the inputted signal level of the received high-frequency signal using only the second relational data based on the measured IFAGC value when the gain of the received high-frequency signal is a maximum value thereof.

3. The high-frequency signal level determining apparatus as claimed in claim 1,
wherein said determining means determines the inputted signal level of the received high-frequency signal using only the first relational data based on the measured RFAGC value when the gain of the received high-frequency signal is not a maximum value thereof.

4. The high-frequency signal level determining apparatus as claimed in claim 1,
wherein said determining means determines a first inputted signal level of the received high-frequency signal using the measured first relational data based on the measured RFAGC value, determined a second inputted signal level of the received high-frequency signal using the measured second relational data based on the measured IFAGC value, and determines an average value of the determines first and second inputted signal levels as the inputted signal level of the received high-frequency signal.

5. The high-frequency signal level determining apparatus as claimed in claim 1,
wherein the received high-frequency signal has a plurality of frequencies,
wherein said determining means previously measures the following parts using two generated high-frequency signals having a maximum frequency and a minimum frequency among the plurality of frequencies, respectively:
(a) a first part of the first relational data indicating the RFAGC value relative to the inputted signal level of the generated high-frequency signal having the maximum frequency;
(b) a first part of the second relational data indicating the IFAGC value relative to the inputted signal level of the generated high-frequency signal having the maximum frequency;
(c) a second part of the first relational data indicating the RFAGC value relative to the inputted signal level of the generated high-frequency signal having the minimum frequency; and
(d) a second part of the second relational data indicating the IFAGC value relative to the inputted signal level of the generated high-frequency signal having the minimum frequency,
wherein said determining means determines a first inputted signal level of the received high-frequency signal using the measured first part of the first relational data based on the measured RFAGC value, determines a second inputted signal level of the received high-frequency signal using the measured first part of the second relational data based on the measured IFAGC value, and determines an average value of the determined first and second inputted signal levels as the inputted signal level of the received high-frequency signal having the maximum frequency,
wherein said determining means determines a third inputted signal level of the received high-frequency signal using the measured second part of the first relational data based on the measured RFAGC value, determines a fourth inputted signal level of the received high-frequency signal using the measured second part of the second relational data based on the measured IFAGC value, and determines an average value of the determined third inputted signal level and the determined fourth inputted signal level as the inputted signal level of the received high-frequency signal having the minimum frequency, and
wherein said determining means calculates the inputted signal level of the received high-frequency signal to be measured using a linear approximation method for linearly approximating the inputted signal level relative to a reception frequency of the received high-frequency signal to be measured based on the determined inputted signal level of the received high-frequency signal having the maximum frequency and on the determined inputted signal level of the received high-frequency signal having the minimum frequency.

6. The high-frequency signal level determining apparatus as claimed in claim 1,
wherein the received high-frequency signal has a plurality of frequencies,
wherein a frequency range including the plurality of frequencies is divided into a plurality of frequency ranges, and
wherein said determining means previously measures the first and second relational data in each of the divided frequency ranges, and determines the inputted signal level of the received high-frequency signal using the measured first and second relational data corresponding to the frequency range to which the frequency of the received high-frequency signal to be measured belongs.

7. The high-frequency signal level determining apparatus as claimed in claim 1,
wherein said determining means previously measures third relational data, that is a determined error in the IFAGC value of the second relational data indicating the IFAGC value relative to the inputted signal level of the received high-frequency signal, the determined error being caused, between a case with an interference signal of a further received high-frequency signal in the vicinity of the frequency of the received high-frequency signal to be measured, and a case with no interference signal thereof, and
wherein said determining means determines the determined error using the third relational data based on the IFAGC value measured for the received high-frequency signal to be measured, and corrects the determined inputted signal level using the determined error.

8. The high-frequency signal level determining apparatus as claimed in claim 1,
wherein said determining means previously measures the following parts:
(a) a first part of third relational data, that is a first determined error in the IFAGC value of the second relational data indicating the IFAGC value relative to the inputted signal level of the received high-frequency signal, the first determined error being caused, between a first case with interference signals of further received high-frequency signals located on both sides of the frequency of the received high-frequency signal to be measured, and a case with no interference signal thereof; and (b) a second part of the third relational data, that is a second determined error in the IFAGC value of the second relational data indicating the IFAGC value relative to the inputted signal level of the received high-frequency signal, the second determined error being caused, between a second case with an interference signal of further received high-frequency signal located on one side of the frequency of the received frequency signal to be measured, and a case with no interference signal thereof, wherein said determining means determines one of the first and second determined errors based on the IFAGC value measured for the received high-frequency signal to be measured using one of the first and second parts of the third relational data which respectively correspond to states in which the received high-frequency signal to be measured is in the first and second cases, and corrects the determined inputted signal level using the determined error.

9. The high-frequency signal level determining apparatus as claimed in claim 1, wherein said determining means represents the first relational data and the second relational data by predetermined approximate functions, respectively, and determines the inputted signal level of the received high-frequency signal using the approximate function of the first relational data and the approximate function of the second relational data.

10. The high-frequency signal level determining apparatus as claimed in claim 1, further comprising display means for displaying the inputted signal level determined by said determining means.

11. A high-frequency signal receiver apparatus, comprising:

a receiver for receiving a high-frequency signal, for converting the received high-frequency signal into an intermediate frequency signal, and for outputting the intermediate frequency signal; and a high-frequency signal level determining apparatus comprising:

an AGC circuit for executing an automatic gain control on the intermediate frequency signal, using an RFAGC value for controlling a gain of the received high-frequency signal and an IFAGC value for controlling a gain of the intermediate frequency signal based on the intermediate frequency signal so that an output level of the intermediate frequency signal is substantially constant; and determining means for previously measuring first relational data indicating an RFAGC value relative to an inputted signal level of the received high-frequency signal and second relational data indicating an IFAGC value relative to the inputted signal level of the received high-frequency signal, for measuring the RFAGC value and the IFAGC value when a high-frequency signal to be measured is received, and for determining the inputted signal level of the received high-frequency signal using the measured first and second relational data based on the measured RFAGC value and IFAGC value, wherein the received high-frequency signal has a plurality of frequencies, and wherein said determining means previously measures a first relational data indicating the RFAGC value relative to the inputted signal level and a second relational data indicating the IFAGC value relative to the inputted signal levels using a generated high-frequency signal having a substantial central frequency among the plurality of frequencies.

12. The high-frequency signal receiver apparatus as claimed in claim 11, wherein said determining means determines the inputted signal level of the received high-frequency signal using only the second relational data based on the measured IFAGC value when the gain of the received high-frequency signal is a maximum value thereof.

13. The high-frequency signal receiver apparatus as claimed in claim 11, wherein said determining means determines the inputted signal level of the received high-frequency signal using only the first relational data based on the measured RFAGC value when the gain of the received high-frequency signal is not a maximum value thereof.

14. The high-frequency signal receiver apparatus as claimed in claim 11, wherein said determining means determines a first inputted signal level of the received high-frequency signal using the measured first relational data based on the measured RFAGC value, determines a second inputted signal level of the received high-frequency signal using the measured second relational data based on the measured IFAGC value, and determines an average value of the determined first and second inputted signal levels as the inputted signal level of the received high-frequency signal.

15. The high-frequency signal receiver apparatus as claimed in claim 11, wherein the received high-frequency signal has a plurality of frequencies, wherein said determining means previously measures the following parts using two generated high-frequency signals having a maximum frequency and a minimum frequency among the plurality of frequencies, respectively:

(a) a first part of the first relational data indicating the RFAGC value relative to the inputted signal level of the generated high-frequency signal having the maximum frequency;

(b) a first part of the second relational data indicating the IFAGC value relative to the inputted signal level of the generated high-frequency signal having the maximum frequency;

(c) a second part of the first relational data indicating the RFAGC value relative to the inputted signal level of the generated high-frequency signal having the minimum frequency; and (d) a second part of the second relational data indicating the IFAGC value relative to the inputted signal level of the generated high-frequency signal having the minimum frequency, wherein said determining means determines a first inputted signal level of the received high-frequency signal using the measured first part of the first relational data based on the measured RFAGC value, determines a second inputted signal level of the received high-frequency signal using the measured first part of the second relational data based on the measured IFAGC value, and determines an average value of the determined first and second inputted signal levels as the inputted signal level of the received high-frequency signal having the maximum frequency, wherein said determining means determines a third inputted signal level of the received high-frequency signal using the measured second part of the first relational data based on the measured RFAGC value, determines a fourth inputted signal level of the received high-frequency signal using the measured second part of the second relational data based on the measured IFAGC value, and determines an average value of the determined third inputted signal level and the determined fourth inputted signal level as the inputted signal level of the received high-frequency signal having the minimum frequency, and wherein said determining means calculates the inputted signal level of the received high-frequency signal to be measured using a linear approximation method for linearly approximating the inputted signal level relative to a reception frequency of the received high-frequency signal to be measured based on the determined inputted signal level of the received high-frequency signal having the maximum frequency and on the determined inputted signal level of the received high-frequency signal having the minimum frequency.

16. The high-frequency signal receiver apparatus as claimed in claim 11, wherein the received high-frequency signal has a plurality of frequencies, wherein a frequency range including the plurality of frequencies is divided into a plurality of frequency ranges, and wherein said determining means previously measures the first and second relational data in each of the divided frequency ranges, and determines the inputted signal level of the received high-frequency signal using the measured first and second relational data corresponding to the frequency range to which the frequency of the received high-frequency signal to be measured belongs.

17. The high-frequency signal receiver apparatus as claimed in claim 11, wherein said determining means previously measures third relational data, that is a determined error in the IFAGC value of the second relational data indicating the IFAGC value relative to the inputted signal level of the received high-frequency signal, the determined error being caused, between a case with an interference signal of a further received high-frequency signal in the vicinity of the frequency of the received high-frequency signal to be measured, and a case with no interference signal thereof; and wherein said determining means determines the determined error using the third relational data based on the IFAGC value measured for the received high-frequency signal to be measured, and corrects the determined inputted signal level using the determined error.

18. The high-frequency signal receiver apparatus as claimed in claim 11, wherein said determining means previously measures the following parts:

(a) a first part of third relational data, that is a first determined error in the IFAGC value of the second relational data indicating the IFAGC value relative to the inputted signal level of the received high-frequency signal, the first determined error being caused, between a first case with interference signals of further received high-frequency signals located on both sides of the frequency of the received high-frequency signal to be measured, and a case with no interference signal thereof, and (b) a second part of the third relational data, that is a second determined error in the IFAGC value of the second relational data indicating the IFAGC value relative to the inputted signal level of the received high-frequency signal, the second determined error being caused, between a second case with an interference signal of further received high-frequency signal located on one side of the frequency of the received high-frequency signal to be measured, and a case with no interference signal thereof, wherein said determining means determines one of the first and second determined errors based on the IFAGC value measured for the received high-frequency signal to be measured using one of the first and second parts of the third relational data which respectively correspond to states in which the received high-frequency signal to be measured is in the first and second cases, and corrects the determined inputted signal level using the determined error.

19. The high-frequency signal receiver apparatus as claimed in claim 11, wherein said determining means represents the first relational data and the second relational data by predetermined approximate functions, respectively, and determines the inputted signal level of the received high-frequency signal using the approximate function of the first relational data and the approximate function of the second relational data.

20. The high-frequency signal receiver apparatus as claimed in claim 11, further comprising display means for displaying the inputted signal level determined by said determining means.

* * * * *